(12) United States Patent
Deliwala et al.

(10) Patent No.: US 6,573,996 B1
(45) Date of Patent: Jun. 3, 2003

(54) METHOD AND APPARATUS FOR ENHANCED PRECISION INTERFEROMETRIC DISTANCE MEASUREMENT

(75) Inventors: Shrenik Deliwala, Brighton, MA (US); Allen Flusberg, Newton, MA (US); Stephen D. Swartz, Cambridge, MA (US)

(73) Assignee: Science Research Laboratory, Inc., Somerville, MA (US)

( * ) Notice: Subject to any disclaimer, the term of this patent is extended or adjusted under 35 U.S.C. 154(b) by 0 days.

(21) Appl. No.: 09/190,777

(22) Filed: Nov. 12, 1998

Related U.S. Application Data

(60) Provisional application No. 60/087,792, filed on Jun. 3, 1998, and provisional application No. 60/065,116, filed on Nov. 12, 1997.

(51) Int. Cl.[7] ................................................. G01B 9/02
(52) U.S. Cl. ........................ 356/487; 356/493; 356/498
(58) Field of Search ............................... 356/484, 485, 356/486, 487, 490, 496–498

(56) References Cited

U.S. PATENT DOCUMENTS

| | | | | |
|---|---|---|---|---|
| 4,125,446 A | * | 11/1978 | Hartsough et al. ........... | 204/192 |
| 4,272,194 A | * | 6/1981 | Gievers ....................... | 356/350 |
| 4,883,357 A | | 11/1989 | Zanoni et al. ............... | 356/349 |
| 4,948,254 A | | 8/1990 | Ishida ......................... | 356/358 |
| 5,106,191 A | * | 4/1992 | Ohtsuka ...................... | 356/349 |
| 5,127,735 A | | 7/1992 | Pitt ............................. | 356/358 |
| 5,404,222 A | | 4/1995 | Lis .............................. | 356/349 |
| 5,757,489 A | * | 5/1998 | Kawakami ................... | 356/349 |
| 5,767,971 A | * | 6/1998 | Kawai et al. ................ | 356/351 |
| 5,923,953 A | * | 7/1999 | Barany et al. ................ | 438/93 |
| 5,991,033 A | * | 11/1999 | Henshaw et al. ............ | 356/349 |
| 6,057,911 A | * | 5/2000 | Reich .......................... | 356/35.5 |
| 6,154,188 A | * | 11/2000 | Learn et al. ................. | 345/75.2 |

OTHER PUBLICATIONS

Two-Laser Optical Distance-Measuring Instrument that Corrects for the Atmospheric Index of K.B. Eranshaw et al., Applied Optics, Apr. 1972, vol. 11, No. 4, pp. 749–754.

"Two-Wavelength Displacement-Measuring Interferometer Using Second-Harmonic Light to Eliminate Air-Turbulence-Induced Errors", Akira Ishida, Japanese J. Appl. Phys., Part 2 (letters), vol. 28, pp. L473–L475, Publication Feb. 13, 1989.

"Residual errors in laser interferometry from air turbulence and nonlinearity", Norman Bobroff, Applied Optics, vol. 26, No. 13, Jul. 1, 1987, pp. 2676–2681.

"An Air Turbulence Compensated Interfermeter for IC Manufacturing," S. Lis, Proc. Spie, vol. 2440, pp. 891–991 (1995).

* cited by examiner

*Primary Examiner*—Frank G. Font
*Assistant Examiner*—Andrew H. Lee
(74) *Attorney, Agent, or Firm*—Wolf, Greenfield & Sacks P.C.

(57) ABSTRACT

A method and apparatus for enhancing the precision of distance or position measurements using a two-wavelength interferometer is disclosed. The invention provides for the direct measurement of air density fluctuations, thus allowing for correction of measurement errors, including those due to air turbulence and air thermal variations in a measurement path of a distance measuring interferometer. The invention can function both as a precision enhancement to an existing interferometric measuring system, or as a stand-alone system, measuring both "uncorrected" distance and air density and providing a corrected distance value. A novel measurement head design removes the constraint that a measurement and a reference component of the interferometer optical signals travel a shared path at any point in the interferometer, and thus substantially reduces errors due to polarization leakage. A novel signal processing technique reduces the cost, size and complexity of a distance or position measurement system according to the invention, and renders the invention particularly useful for lithographic integrated-circuit wafer production applications with critical dimensions below 0.1 $\mu$m.

32 Claims, 9 Drawing Sheets

METHOD AND APPARATUS FOR ENHANCED PRECISION INTERFEROMETRIC DISTANCE MEASUREMENT

CROSS-REFERENCE TO RELATED APPLICATIONS

This application claims the benefit of U.S. Provisional Application No. 60/065,116, filed Nov. 12, 1997, and U.S. Provisional Application No. 60/087,792, filed Jun. 3, 1998.

FIELD OF THE INVENTION

This invention relates to interferometric distance measurements using optical signals, and more particularly to a method and apparatus for enhancing precision of such measurement by virtually eliminating polarization leakage problems in an interferometer and by compensating for undesirable variations in the system, including variations caused by air turbulence.

BACKGROUND OF THE INVENTION

Interferometers are currently utilized for distance and position measurement in a variety of applications including lithographic integrated-circuit wafer production, measuring satellite position in global position sensing (GPS) systems, and measuring distance to detectors in earthquake detection systems. In all of these systems, undesirable perturbations of the interferometer optical signals due to natural phenomena or other variations in system parameters can result in small errors in the distances being measured.

One particular source of errors is air turbulence in the measurement space through which an interferometer optical signal, such as a light beam, passes. Turbulence is defined for purposes of this invention as variation in local density of the air in the measurement space. Such air density variations can result from a number of factors, including local temperature variations and air movement. Since the refractive index of the air through which the optical signal passes varies slightly with the density of the air, such turbulence can cause small errors in the distance measurements, as the distance measurement is a function of the wavelength of the optical signal and the refractive index of the air.

Existing high quality single-wavelength interferometers can measure an optical path-length, for example a path-length used in lithography as a measure of stage position, with a theoretical precision on the order of 1 nm or better. However, turbulence of the air in the interferometer optical signal path typically contributes variations of 10–30 nm to the measured path-length during the typical time period in which an integrated-circuit wafer is exposed.

Since such single-wavelength interferometers cannot distinguish between path-length changes due to this air turbulence and those due to stage motion, air turbulence has the effect of degrading the precision of these interferometers to a point where they are marginally capable of supporting 0.25 $\mu$m-design-rule lithography. Hence, 0.1 $\mu$m-design-rule lithography and below, which are becoming increasingly important in the industry, present significant challenges to the accuracy and precision of single-wavelength interferometers. As a result, under typical wafer production conditions, the overlay precision of single-wavelength interferometers is limited by air turbulence to approximately 10–30 nm, which is an unacceptably large imprecision for 0.1 $\mu$m-design-rule lithography.

One solution which has been proposed to overcome the air turbulence problem is for two interferometers employing light beams having significantly different wavelengths (or frequencies) to share a common measurement path. The optical path-length of the measurement path "seen" by each light beam will differ because the refractive index of air is a function of wavelength. This small but significant difference can be used to directly determine the optical "thickness" of the air path, allowing a correction for turbulence to be made.

While conventional interferometer systems utilizing two light beams have purportedly improved measurement precision by correcting for air turbulence, in general such systems are not readily integrated with existing single-wavelength interferometers to improve the precision of single-wavelength interferometers. Additionally, the precision of conventional multi-wavelength interferometers is limited by factors other than air turbulence, which render such interferometers marginally capable of meeting the stringent requirements of very high precision applications, for example, 0.1 $\mu$m-design-rule lithography, as discussed above.

SUMMARY OF THE INVENTION

In view of the foregoing, there is a need for an improved technique to eliminate or compensate for various potential overlay error sources for position lithography applications, particularly in 0.1 $\mu$m-design-rule lithography. In general, an improved precision interferometric distance measurement technique is desirable in order to eliminate or compensate for various sources of measurement error, including air turbulence, in these and other interferometer applications.

For example, an additional problem with conventional single or multi-wavelength interferometers, unrelated to the problem of air turbulence, is polarization leakage or optical nonlinearity. This problem arises because the optical signal splitters typically employed in conventional interferometers to separate the optical signal into two polarized components are imperfect, and therefore some percentage of the optical signal polarized to pass through one of two optical paths is, in fact, in the other of the two optical paths. The nonlinearity of measurements resulting from this "crosstalk" error presents a problematic limit to precision in conventional interferometers, and a solution to this problem would provide an advantage in further enhancing the precision of interferometric distance or position measurements.

It is additionally desirable that an improved interferometer system be achromatic (function equivalently for a wide range of wavelengths), that any precision enhancement and error correction mechanism be compatible with conventional interferometers and require minimal additional space (for purposes of "retrofitting" an existing interferometer with the improved interferometer system), and that the technique utilized for error correction be easily adaptable to perform a "baseline" interferometer distance measuring function, in addition to the error correction function, to provide an enhanced precision distance measurement.

It is also desirable, particularly with respect to lithographic integrated-circuit wafer production applications, that all electrical signals and potential heat generating components be mounted remotely from an interferometer measurement head and from any lithographic components so that the measurement head for the system, which may be mounted to the lithographic stage, is completely passive and contains no thermal sources, thereby eliminating a potential limitation on measurement precision. Further, it is desirable that the passive measurement head itself be extremely insensitive to ambient temperature variations, thereby overcoming temperature drift problems that have also been a source of error in conventional interferometers. Finally, the measurement head should be rugged and inherently insensitive to motion and vibration.

In accordance with the above, the present invention provides a method and apparatus for enhancing the precision of interferometric distance and position measurements.

One example of the present invention is an inexpensive compact two-wavelength interferometer using an analog radio-frequency (RF) heterodyne-mixing signal processing technique, alone or in combination with digital signal processing techniques, and a novel measurement head design, which can significantly reduce measurement errors, such as those due to air turbulence, to less than 1 nm by simultaneously measuring an optical path-length at two different wavelengths. The two different wavelengths may be harmonically related, or may have an arbitrary wavelength relationship.

One aspect of the present invention is an achromatic interferometer design that allows complete integration of an interferometer according to the present invention with a conventional baseline measurement system. The design permits a non-invasive retrofit requiring no modification of the baseline system and allows all optical signals to share a single, compact measurement head.

Another aspect of the present invention is an interferometer system that virtually eliminates the optical nonlinearity "crosstalk" problem due to polarization leakage, common to conventional interferometers, thereby improving an intrinsic (no-turbulence) precision of a baseline interferometer according to the invention to better than 1 nm. This is accomplished primarily by a unique measurement head design which allows a measurement and a reference optical signal to travel distinct paths throughout the system, for example, by spatially different paths, different path directions, or different polarizations.

Another aspect of the present invention is an achromatic interferometer system that includes a passive interferometer measurement head with no thermal sources that could limit the measurement precision.

Another aspect of the present invention is an interferometer measurement head which is extremely insensitive to temperature variations.

Another aspect of the present invention is a monolithic interferometer measurement head design which makes the head rugged and inherently insensitive to motion and vibration.

Another example of the present invention is a single-wavelength interferometer which is added to an existing conventional baseline system to allow for measurement precision enhancement by, for example, correcting for errors, such as those due to air turbulence, and minimizing measurement nonlinearity due to polarization leakage. The baseline optical signal can serve as one of the two-optical signals required to measure the optical path-length difference due to the wavelength-dependent refractive index of air, while simultaneously measuring absolute distance or position.

Another example of the present invention is an achromatic interferometer, using an analog radio-frequency (RF) heterodyne-mixing signal processing technique, alone or in combination with digital signal processing techniques, that can function as a stand-alone system, measuring absolute distance or position and simultaneously correcting for measurement errors, including those due to air turbulence.

Another example of the present invention is a multiple-axis positioning system which employs one two-wavelength interferometer of the present invention for each degree of freedom of movement, or positional axis. One optical signal source may be used for each wavelength required, regardless of the number of axes controlled by the positioning system. The respective optical signal source powers can be split amongst the respective interferometers required for each axis.

Another example of the present invention is an interferometer apparatus comprising an optical module to modulate at least first and second optical signals with at least first and second modulating signals, respectively, to provide at least first and second modulated optical signals. The interferometer apparatus also includes a measurement head optically coupled to the optical module and constructed and arranged to direct each modulated optical signal through a reference optical path and a measurement optical path. The optical module is constructed and arranged to optically process each modulated optical signal after each modulated optical signal has traveled through the reference and measurement optical paths. The optical module outputs at least two difference signals, each difference signal corresponding to a respective modulated optical signal and having a difference signal frequency derived from a respective modulating signal. Each difference signal represents a path-length difference between the reference and measurement optical paths of the respective modulated optical signal. The interferometer apparatus may also include a signal processor to process the difference signals to output a correction signal based on a beat frequency derived from the first and second modulating signals. The correction signal represents a path-length difference between the measurement optical paths of the first and second modulated optical signals.

Another example of an interferometer apparatus according to the invention comprises at least one optical signal and a splitter to divide each optical signal into a reference component and a measurement component, to form a reference component set and a measurement component set. The interferometer apparatus also includes a plurality of optical elements arranged to direct the reference component set through a reference optical path and the measurement component set through a measurement optical path. The reference optical path is distinct from the measurement optical path throughout the apparatus. The apparatus further includes at least one detector to detect the reference and measurement components of each optical signal after the components have traveled through the reference and measurement optical paths, respectively. The detector outputs at least one difference signal based on a path-length difference between the reference and measurement optical paths, wherein each difference signal corresponds to a respective optical signal. The plurality of optical elements may be arranged such that the reference and measurement component sets do not travel in a like direction on a shared optical path. The plurality of optical elements may also include a measurement head, wherein the plurality of optical elements are arranged such that the reference and measurement component sets arrive at the measurement head on spatially separated paths.

Other objects, novel features and advantages of the present invention will become apparent to those skilled in the art through the description of a preferred but not exclusive embodiment, claims, and accompanying drawings.

BRIEF DESCRIPTION OF THE DRAWINGS

The accompanying drawings, which are incorporated herein by reference, are not intended to be drawn to scale. In the drawings, each identical or nearly identical component that is illustrated in various figures is represented by a like numeral. For purposes of clarity, not every component may be labeled in every drawing.

In the drawings.

DETAILED DESCRIPTION

Figure 1:
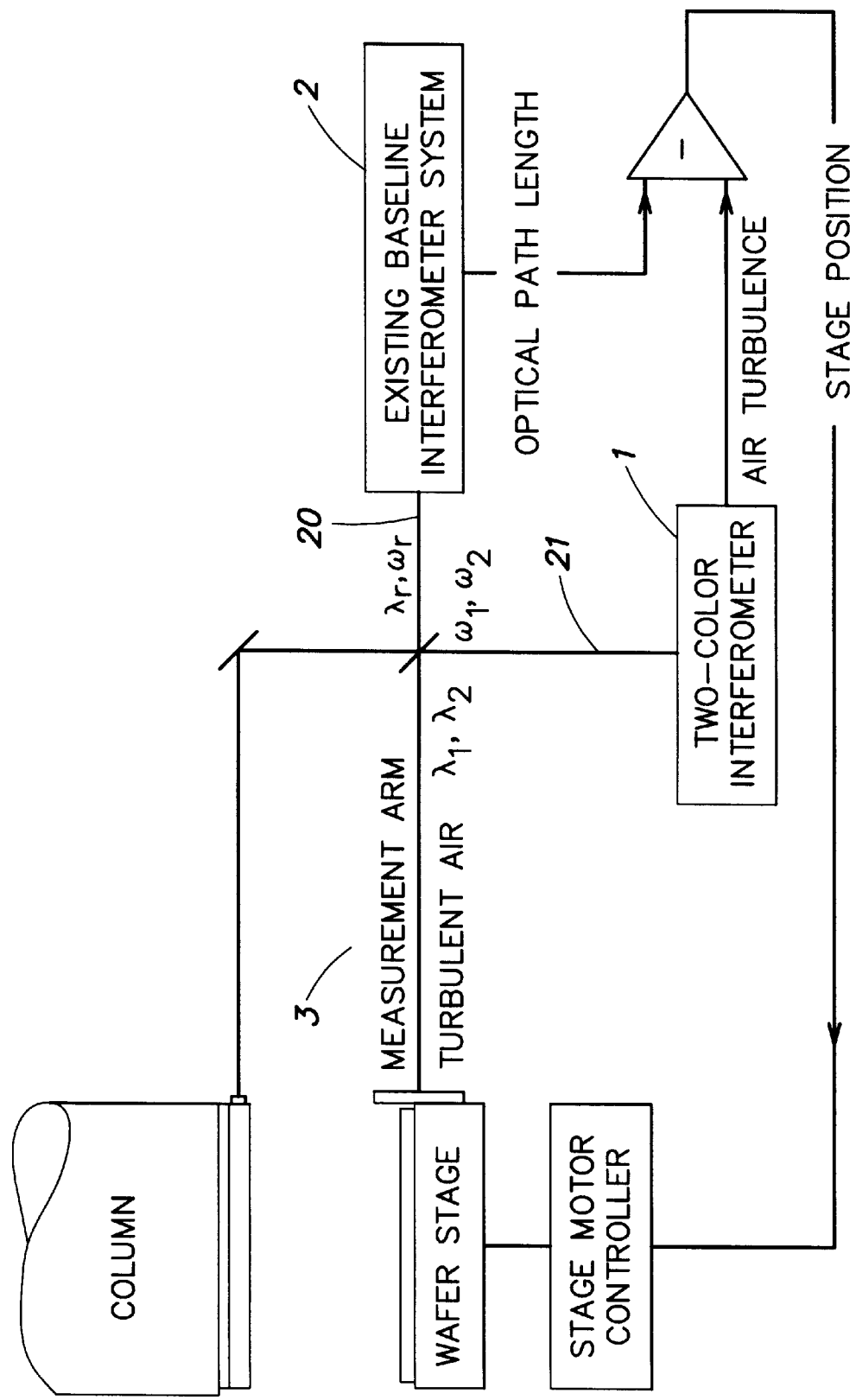
FIG. 1 is a block diagram illustrating an example of an interferometer apparatus according to one embodiment of the invention, integrated with a baseline interferometer system.

FIG. 1 shows an example of an interferometer apparatus according to one embodiment of the present invention. An achromatic interferometer system design allows the integration of a two-wavelength interferometer 1 with an existing baseline interferometric system 2 having a third wavelength. The two-wavelength interferometer 1 utilizes a first optical signal having a wavelength $\lambda_1$, with a frequency $\omega_1=2\pi/\lambda_1$, and a second optical signal having a wavelength $\lambda_2$, with a frequency $\omega_2=2\pi/\lambda_2$. Throughout the disclosure, each optical signal may be referred to in terms of either its wavelength or frequency.

As a non-limiting example for the purposes of illustration, the wavelength combination of $\lambda_{1,2}=1064, 532$ nm may be used for the two optical signals, where $\lambda_1$ is referred to as "the fundamental" and $\lambda_2=\lambda_1/2$ is referred to as its "second harmonic", with a frequency $\omega_2=2\omega_1$. The wavelength choice $\lambda_{1,2}=1064, 532$ nm in some instances may have the advantage of optimizing performance, minimizing cost, and maximizing integrability with conventional interferometric stage-position control systems. For example, a frequency-doubled Nd:YAG laser may be used as an optical signal source for the two wavelengths in such an interferometer. It should be appreciated, however, that optical sources having respective wavelengths $\lambda_1$ and $\lambda_2$, wherein the wavelengths have an arbitrary relationship, are suitable for an interferometer apparatus according to the present invention.

Figure 2:
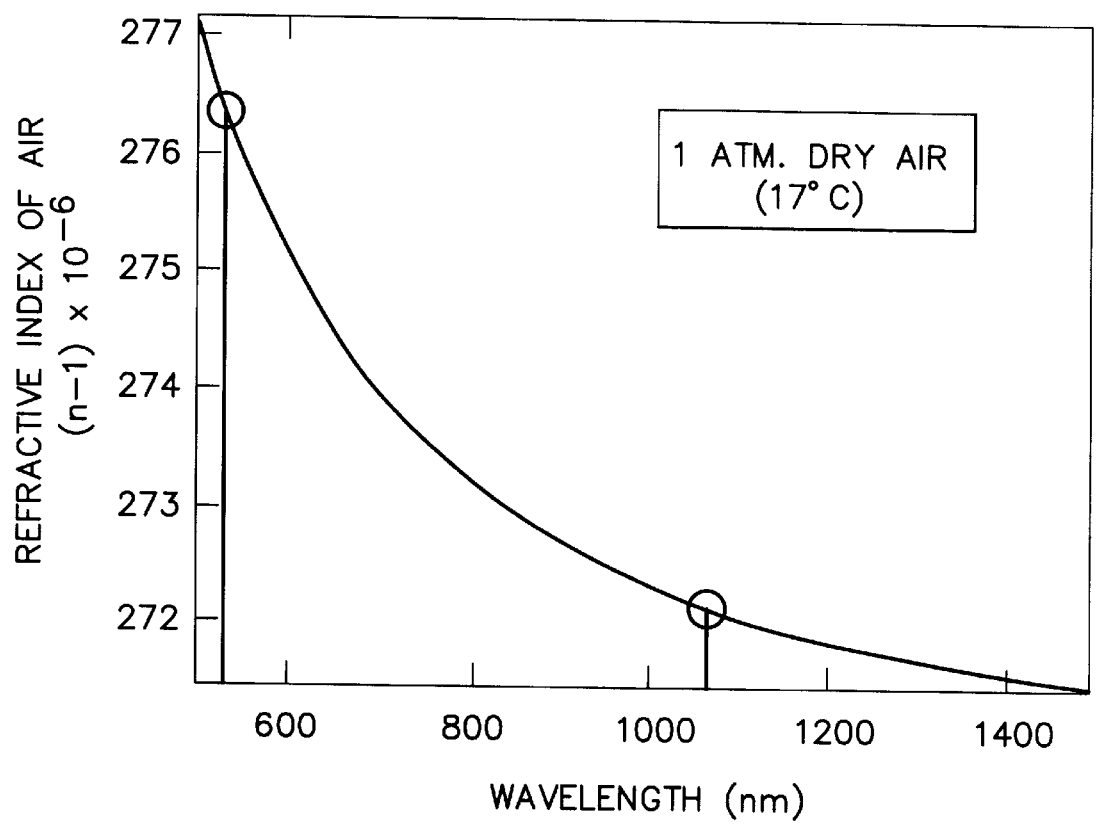
FIG. 2 is a graph of the wavelength dependence of the refractive index of air.

When the two-wavelength interferometer 1 is integrated with an existing baseline system 2, optical signals at the two wavelengths $\lambda_{1,2}$ travel a measurement optical path through a measurement "arm" 3 which is exactly the same as the measurement optical path traveled by the baseline system optical signal having a third wavelength $\lambda_r$ and frequency $\omega_r=2/\lambda_r$. Coherent detection at each wavelength measures a phase shift that is proportional to a corresponding optical path-length (OPL) through the measurement arm 3. The OPLs at $\lambda_1$ and $\lambda_2$ differ very slightly because of dispersion in the refractive index of air. As shown in FIG. 2, the refractive index n of air is a function of wavelength. The abscissa of FIG. 2 represents wavelength and the ordinate represents the refractive index.

The theoretical framework for the measurement of the optical path-length is now described using the subscript indices j=1, 2, r to indicate parameters associated with the respective wavelength of the various optical signals. The optical path-length $\zeta_j$ at wavelength $\lambda_j$ through a length L of air whose density is not constant may be written $$\zeta_j = L + \beta_j L \left[1 + \frac{\delta \rho}{\rho_0}\right], \quad (1)$$

where $\beta\rho=\rho(t)-\rho_0$ is the difference between the instantaneous path-averaged air density $\rho(t)$ and its temporal mean $\rho_0$. $\beta_j$ is the Gladstone-Dale constant given by $\rho_0(dn_j/d\rho)$, where $n_j$ is the refractive index of air at the wavelength of interest. The baseline interferometric system measures the turbulence-uncorrected total path-length $L_u$ which can be expressed as $$L_u = \frac{\zeta_r}{1+\beta_r}. \quad (2)$$

The actual total path-length L may be written as $$L=L_u+L_{tc}, \quad (3)$$

where $L_{tc}$ is the turbulence correction. From Eqs. (1–3) it follows that, to an excellent approximation, $$L_{tc} = \beta_r \left[L_u - \frac{\zeta_{21}}{\beta_{21}}\right]. \quad (4)$$

The quantities $\beta_{21}=\beta_2-\beta_1$, which is the refractivity difference, and $\beta_r$ are known constants, while the instantaneous value of $L_u$ is calculated from a measurement of $\zeta_r$ by the baseline system. The present invention makes an instantaneous measurement of the optical path-length difference $\zeta_{21}=\zeta_2-\zeta_1$, allowing $L_{tc}$, be determined. Variations in the OPL difference $\zeta_{21}$ directly track variations due to air turbulence in the integrated thickness of the air column in the measurement arm.

Figure 3:
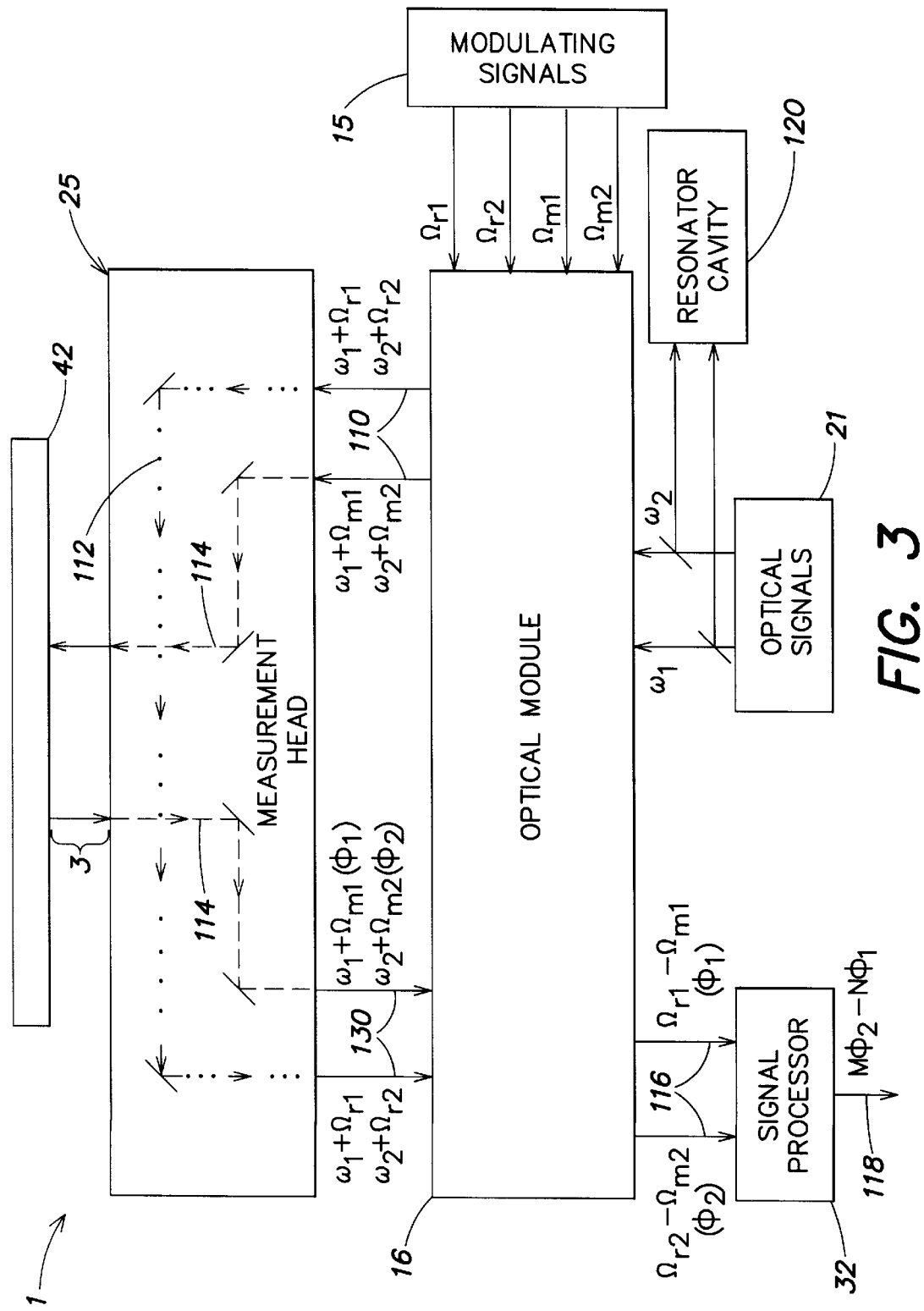
FIG. 3 is a block diagram of an example of a two-color interferometer according to one embodiment of the invention.

FIG. 3 shows a block diagram of an example of a two-wavelength interferometer apparatus 1 according to one embodiment of the present invention. The interferometer apparatus 1 includes an optical module 16 to modulate at least first and second optical signals 21 with at least first and second modulating signals 15, respectively, to provide at least first and second modulated optical signals 110. The interferometer apparatus also includes a measurement head 25 optically coupled to the optical module 16, and constructed and arranged to direct each modulated optical signal 110 through a reference optical path 112, a portion of which is shown schematically in FIG. 3 as a dotted line within measurement head 25, and a measurement optical path 114, a portion of which is also shown schematically in FIG. 3, as a dashed line through measurement head 25. FIG. 3 also shows a fixed mirror 42 in the measurement optical path 114, separated from the measurement head by measurement arm 3. The measurement arm 3, which is part of measurement optical path 114, may be subject to various disturbances, including air turbulence.

The optical module 16 of the interferometer apparatus 1 shown in FIG. 3 is constructed and arranged to optically process each modulated optical signal 110 after each modulated optical signal has traveled through the reference and measurement optical paths 112 and 114 in measurement head 25. The optical module 16 outputs at least two difference signals 116, wherein each difference signal 116 corresponds to a respective modulated optical signal 110 and has a difference signal frequency derived from a respective modulating signal 15. Each difference signal 116 represents a path-length difference between the reference optical path 112 and the measurement optical path 114 of the respective modulated optical signal 110.

The interferometer apparatus 1 of FIG. 3 may also include a signal processor 32 to process the difference signals 116 to output a correction signal 118 based on a beat frequency derived from the first and second modulating signals of the at least two modulating signals 15. The correction signal 118 represents a path-length difference between the measurement optical paths 114 of the first and second modulated optical signals 110.

FIG. 3 shows that the at least two optical signals 21 have frequencies of $\omega_1$ and $\omega_2$, respectively. As discussed above, the frequencies $\omega_1$ and $\omega_2$ may be harmonically related or may have an arbitrary relationship. Optical signal sources suitable for purposes of the invention include, but are not limited to, harmonically related lasers, for example frequency doubled lasers. In general, the frequencies of such lasers may vary, but they are locked so as to remain in a harmonic ratio. Alternatively, optical sources having arbitrary wavelength relationships may be used to provide the at least two optical signals 21, but generally, such sources are not locked to one another. However, regardless of the source of the optical signals 21, it is possible to lock two or more optical sources to each other such that a constant frequency ratio is maintained between the optical signals. FIG. 3 shows that the interferometer apparatus 1 may include an optional resonator cavity 120 for the purpose of locking optical sources and maintaining a constant frequency ratio between the optical signals 21.

Figure 4:
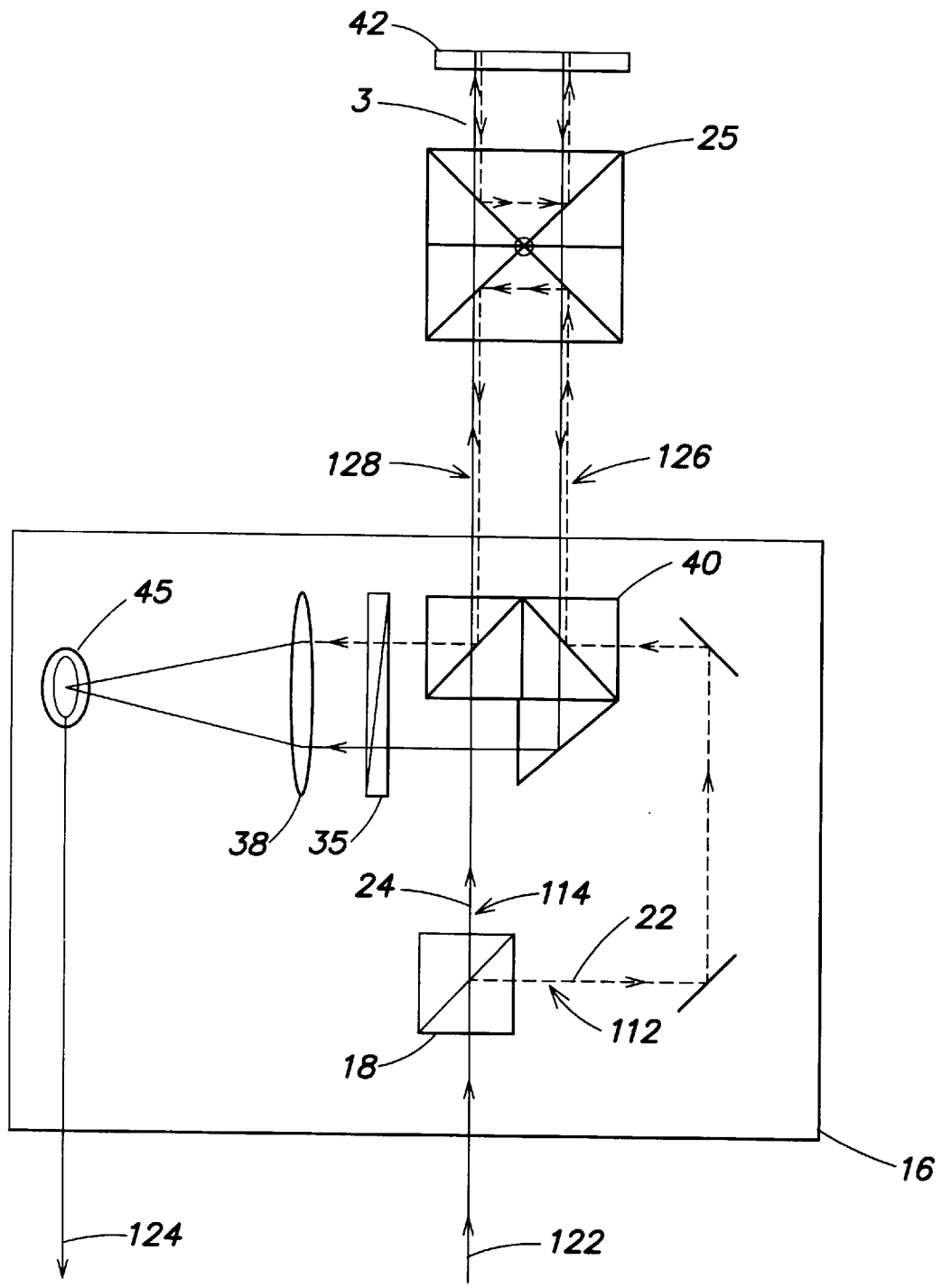
FIG. 4 is a schematic diagram showing an arrangement of optical elements according to one embodiment of the invention.

FIG. 4 is a schematic diagram showing an example of an arrangement of optical elements in an interferometer according to one embodiment of the invention. While the example arrangement of optical elements illustrated in FIG. 4 is useful for the two-wavelength interferometer 1 of FIG. 3, it should be appreciated that the layout of optical elements schematically illustrated in FIG. 4 provides advantages as a single-wavelength interferometer as well. The arrangement of optical elements illustrated in FIG. 4 emphasizes specific features of an interferometer according to one embodiment of the invention particularly directed to substantially minimizing an optical nonlinearity of an interferometer signal representing a path-length difference between a measurement and reference path, due to a polarization leakage between optical signals traveling the reference and measurement paths, respectively.

Accordingly, for purposes of illustration and clarity, FIG. 4 shows only the propagation of a single optical signal 122, similar to optical signals 21, through an optical module 16 to a measurement head 25, and returning to optical module 16 to output a single difference signal 124. As discussed above, the arrangement of FIG. 4 may be implemented with any number of optical signals similar to optical signals 21.

The interferometer apparatus of FIG. 4 includes a splitter 18 to divide at least one optical signal 122. The splitter divides each optical signal 122 into a reference component and a measurement component to form a reference component set 22 and a measurement component set 24. It should be appreciated that if only one optical signal 122 is input to optical module 16, reference component set 22 will include only one reference component, and likewise measurement component set 24 will include only one measurement component.

After splitter 18, FIG. 4 shows that the reference component set 22, indicated by a dashed line, and the measurement component set 24, indicated by a solid line, propagate in the interferometer apparatus through a plurality of optical elements within both optical module 16 and measurement head 25. The plurality of optical elements is arranged to direct the reference component set 22 through a reference optical path 112 and the measurement component set 24 through a measurement optical path 114.

A particular feature of the arrangement of optical elements illustrated in FIG. 4 is that the reference optical path 112 is distinct from the measurement optical path 114 throughout the apparatus. Arrangements of optical elements other than that illustrated in FIG. 4 are possible and are intended to be within the scope of the present invention. For example, the optical elements may be arranged such that the reference and measurement component sets do not travel in a like direction on a shared optical path anywhere within the apparatus. Moreover, the reference and measurement component sets may counterpropagate on a shared optical path, the reference component set may have a different polarization than the measurement component set, the reference and measurement component sets may be spatially separated if they are traveling in a like direction, or any combination of the above criteria. The requirement that the reference optical path be distinct from the measurement optical path minimizes the number of optical elements that are "shared" by both the reference and measurement component sets.

It should be appreciated that the reference optical path 112 and the measurement optical path 114 each refer to an entire optical path traveled by the reference component set 22 and the measurement component set 24, respectively, throughout the interferometer apparatus after each component set exits the splitter 18. As shown in both FIGS. 3 and 4, a portion of the measurement optical path 114 includes a measurement arm 3, which generally represents a path-length difference between the reference optical path 112 and the measurement optical path 114.

The interferometer apparatus of FIG. 4 also includes at least one detector 45 to detect the reference and measurement components of optical signal 122 after the components have traveled through the reference and measurement optical paths, respectively. The detector 45 outputs at least one difference signal 124 based on the path-length difference between the reference and measurement optical paths represented by measurement arm 3, as discussed above in connection with FIG. 3. If more than one optical signal 122 is used, each difference signal 124 output by detector 45 corresponds to a respective optical signal 122.

FIG. 4 also illustrates that the optical elements of optical module 16 and the measurement head 25 are arranged such that the reference and measurement component sets 22 and 24 arrive at the measurement head 25 on spatially separated first and second paths 126 and 128, respectively. Furthermore, the measurement head 25 is constructed and arranged so as to direct the reference component set 22 through at least one pass of the reference optical path 112. The reference component set 22 arrives at the measurement head 25 on first path 126 and exits the measurement head through second path 128, as indicated by a dashed line. The measurement head also directs the measurement component set 24 through at least one pass of the measurement optical path 114. The measurement component set 24 arrives at measurement head 25 on second path 128 and exits the measurement through first path 126, as indicated by a solid line.

Figure 9:
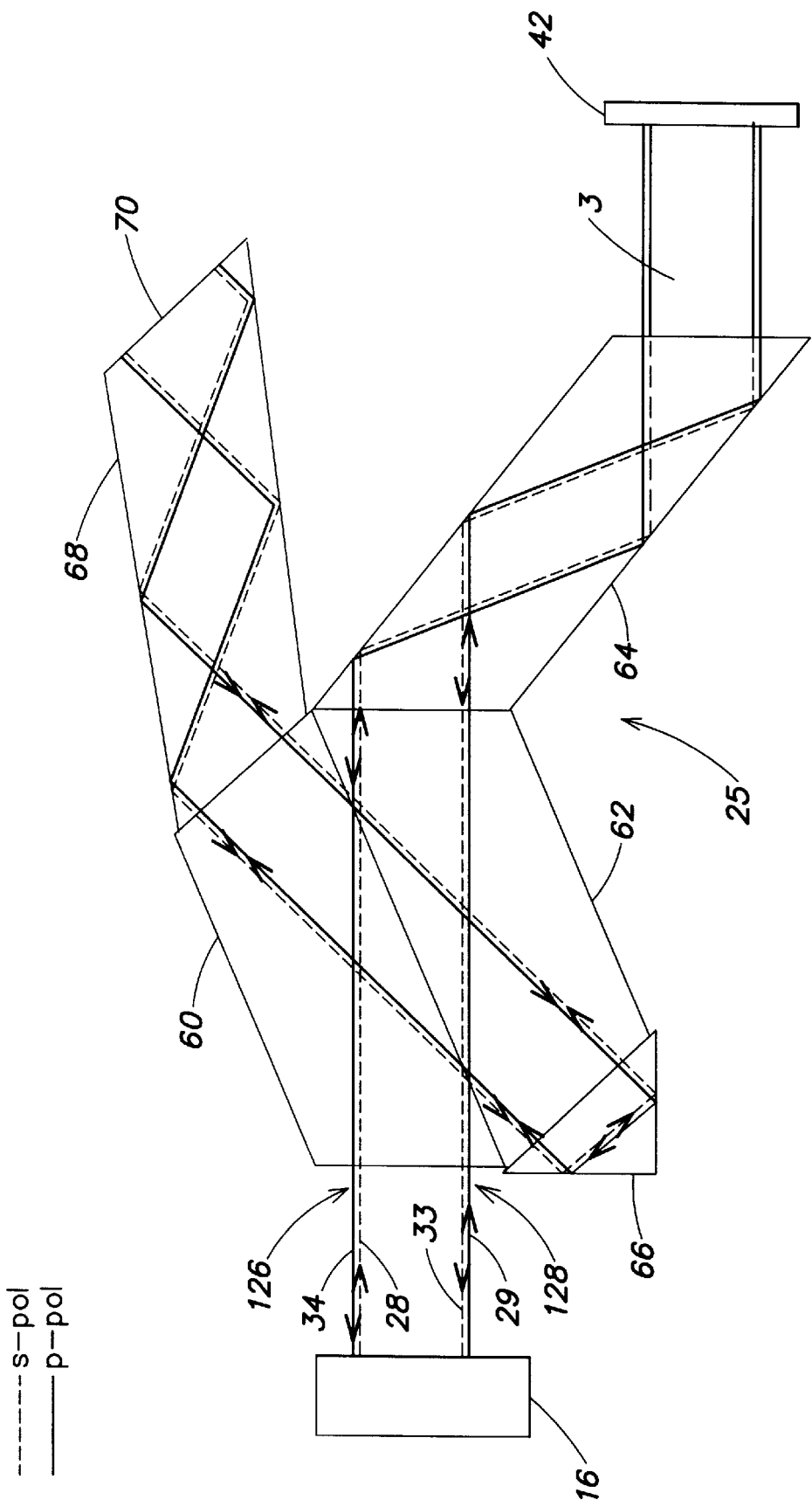
FIG. 9 is a diagram of an example optical layout of an interferometer measurement head according to one embodiment of the invention.

In FIG. 4, the arrangement of optical elements in measurement head 25 is shown schematically for purposes of illustration only. A more detailed diagram of the optical elements and layout of measurement head 25 is shown in FIG. 9, and discussed further below. It should be appreciated that, while not readily apparent from the schematic diagram of FIG. 4, the measurement head 25 is constructed such that the reference and measurement component sets travel like path-lengths through the measurement head 25.

In one example of an interferometer apparatus according to FIG. 4, the splitter 18 is a polarizer. The reference component set 22 has a first polarization, and the measurement component set 24 has a second polarization orthogonal to the first polarization. The measurement head 25 is constructed and arranged such that the reference component set 22 and the measurement component set 24 maintain their respective polarizations upon arriving to and exiting from the measurement head 25. Optical assembly 40 of optical module 16 may also include one or more polarizing splitters. As discussed earlier, the splitter 18, the optical assembly 40, and the measurement head 25 are arranged so as to substantially minimize an optical nonlinearity of the difference signal 124 due to a polarization leakage between the reference and measurement component sets 22 and 24, respectively. As can be seen from the arrangement of optical elements in FIG. 4, the polarizing elements of optical assembly 40 do not split any one optical signal into two constituent parts, but merely direct or pass any optical signal incident to the optical assembly 40. Optical assembly 40 will be discussed in greater detail below, in connection with FIG. 8.

The plurality of optical elements of the interferometer apparatus illustrated in FIG. 4 may also include an interferometric beam combiner 35 to rotate the first and second polarizations of the reference and measurement components of each optical signal 122, respectively, before the reference and measurement components are detected by the detector 45. The interferometric beam combiner 35 may be, for example, a polarizer/analyzer oriented at 45° with respect to first and second planes of polarization corresponding to the first and second polarizations, respectively. The optical module 16 may also include a lens 38 to focus the polarization-rotated interferometrically combined reference and measurement components onto detector 45.

Figure 5:
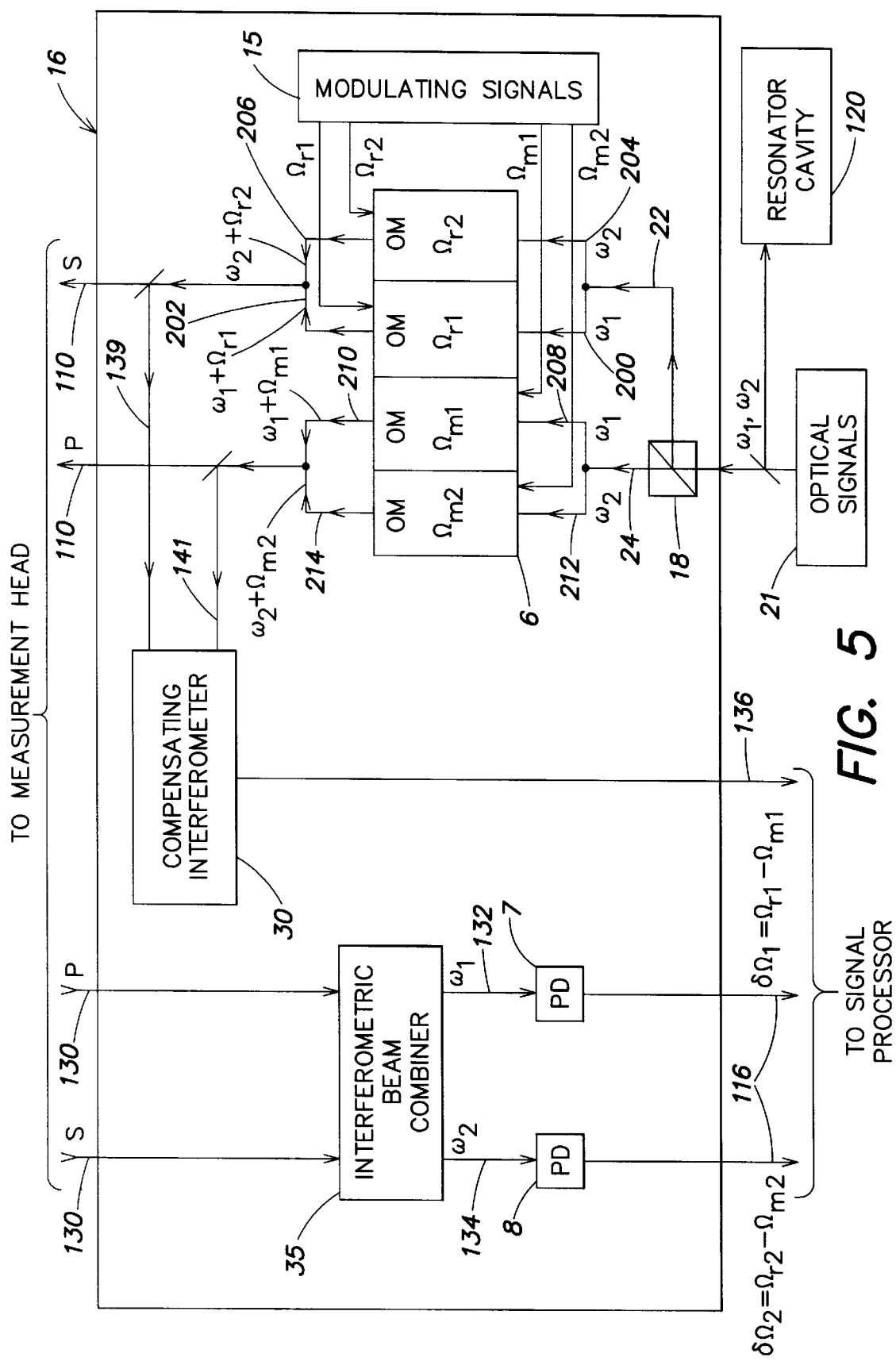
FIG. 5 is a more detailed block diagram of an optical module of the two-color interferometer of FIG. 3.

FIG. 5 is a more detailed block diagram of the optical module 16 of the two-wavelength interferometer 1 illustrated in FIG. 3. While FIG. 4 illustrated an example of an arrangement of optical elements included in optical module 16 to direct optical signals, the block diagram of FIG. 5 highlights the optical signal modulation functions of the optical module 16.

FIG. 5 shows that the optical module 16 of FIG. 3 includes optical modulators 6 to modulate at least one of the reference and measurement components of each optical signal 21. Optical modulators 6 may be, for example, acousto-optic modulators. As in FIG. 4, each optical signal 21 is divided by splitter 18 to form a reference component set 22 and a measurement component set 24. It should be appreciated that the optical paths illustrated in FIG. 5 are shown schematically for purposes of illustration only, and that several optical elements, as shown in FIG. 4, may not be included in FIG. 5 for clarity.

FIG. 5 shows that each optical signal (of frequency $\omega_1$ or $\omega_2$) of each component set 22 and 24 may be input to a respective optical modulator 6. Each optical modulator is driven by a respective modulating signal 15. For purposes of the present invention, only one of the component sets 22 and 24 need be modulated by respective optical modulators 6 but, as illustrated in FIG. 5, both component sets 22 and 24 may be modulated by respective optical modulators 6. The general requirement of the optical signal modulating scheme according to one embodiment of the invention is that the reference component of each optical signal has a frequency that is shifted by a known amount with respect to a frequency of the measurement component of each optical signal.

For example, in FIG. 5, optical signal 200 of reference component set 22, having a frequency $\omega_1$, is shown to be modulated by modulating signal $\Omega_{r1}$ to provide an optical signal 202, having a frequency $(\omega_1 + \Omega_{r1})$. The optical signal 204 having the frequency $\omega_2$ of reference component set 22 is modulated by modulating signal $\Omega_{r2}$ to provide a modulated optical signal 206 having a frequency $(\omega_2 + \Omega_{r2})$ Similarly, the optical signal 208 having a frequency $\omega_1$ of measurement component set 24 may be modulated by modulating signal $\Omega_{m1}$ to provide a modulated optical signal 210 having a frequency $\omega_1 + \Omega_{m1}$, and the optical signal 212 having a frequency $\omega_2$ of measurement component set 24 may be modulated by modulating signal having a frequency $\Omega_{m2}$ to provide a modulated optical signal 214 having a frequency $\omega_2 + \Omega_{m2}$. The frequencies of the reference and measurement components of each optical signal 202, 206, 210, and 214 exiting the optical modulators 6 have a known relationship such that:

$$\delta\Omega_1 = \Omega_{r1} - \Omega_{m1};$$

$$\delta\Omega_2 = \Omega_{r2} - \Omega_{m2}. \quad (5)$$

The combined modulated optical signals 110 exit the optical module 16 and proceed to the measurement head 25, as shown in FIGS. 3 and 4.

FIG. 5 shows that the modulated optical signals 130 are returned to optical module 16 from measurement head 25, and are interferometrically combined by interferometric beam combiner 35. The interferometric beam combiner 35 recombines the reference component and the measure component of each optical signal 21. The recombined optical component signals 132 and 134 simultaneously illuminate two photodiode detectors 7 and 8, similar to photodiode detector 45 of FIG. 4. It should be appreciated that each of photodiode detectors 7, 8, and 45 has an optical frequency response suitable for detecting optical signals 21 and has an electrical frequency response that includes the modulation signals 15, as discussed further below. Furthermore, in FIG. 5, while two photodiode detectors 7 and 8 are shown to detect the respective recombined optical signals 132 and 134, alternatively a single optical detector may be used to detect both of the recombined optical signals 132 and 134 provided that the single optical detector is sensitive to the optical frequency of each of the recombined optical signals.

In FIG. 5, when the two optical signal components from modulated optical signals 130 having frequencies $(\omega_1 + \Omega_{r1})$ and $(\omega_1 + \Omega_{r2})$ are recombined by interferometric beam combiner 35, the interference between these frequency components produces an optical signal 132 with an intensity $I_1$ that is modulated at $\delta\Omega_1 = (\Omega_{r1} - \Omega_{m1})$ with a phase $$\phi_1 = \frac{2\pi L}{\lambda_1}\left[1+\beta_1\left(1+\frac{\delta\rho}{\rho_0}\right)\right], \qquad (6)$$

corresponding to the path-length difference between the reference and measurement optical paths traveled by the optical signals having a frequency near $\omega_1$. Similarly, when the optical signal components from modulated optical signals 130 having frequencies $(\omega_2+\Omega_{r2})$ and $(\omega_2+\Omega_{m2})$ are recombined by interferometric beam combiner 35, the interference between these frequency components produces an optical signal 134 with an intensity $I_2$ that is modulated at $\delta\Omega_2=(\Omega_{r2}-\Omega_{m2})$ with a phase $$\phi_2 = \frac{2\pi L}{\lambda_2}\left[1+\beta_2\left(1+\frac{\delta\rho}{\rho_0}\right)\right], \qquad (7)$$

corresponding to the path-length difference between the reference and measurement optical paths traveled by the optical signals having a frequency near $\omega_2$.

The photodiode detectors 7 and 8 output difference signals 116 having frequencies corresponding to the differences or "shifts" $\delta\Omega_1$ and $\delta\Omega_2$ between the respective frequencies of the modulating signals 15, as discussed above in connection with Eq. (5). It is noteworthy that while the frequencies of the difference signals 116 output from the photodiode detectors are $\delta\Omega_1$ and $\delta\Omega_2$, the respective phases $\phi_1$ and $\phi_2$ of these difference signals are functions of the optical wavelengths $\lambda_1$ and $\lambda_2$ (or optical frequencies $\omega_1$ and $\omega_2$), as given by Eqs. (6) and (7).

According to the present invention, as discussed above, in general both optical signals 21 of both the reference and measurement component sets 22 and 24 may be modulated in respective optical modulators 6 by modulating signals 15 such that $$M(\Omega_{r2}-\Omega_{m2})=N(\Omega_{r1}-\Omega_{m1})+\Delta, \qquad (8)$$

where the indices r and m denote reference and measurement components of the optical signals 21, the indices 1 and 2 denote respective frequencies $\omega_1$ and $\omega_2$ of the optical signals 21, and M and N are integers. The quantity $\Delta$ is selected as a precise low frequency offset or "beat" frequency. The beat frequency is selected to be substantially less than each of the difference frequencies $\delta\Omega_1$ and $\delta\Omega_2$, as discussed further below.

FIG. 5 also shows that optical module 16 may additionally include a compensating interferometer 30 which outputs a compensation signal 136. The compensating interferometer receives a first tap 139 of the modulated optical signals 110 corresponding to the reference component set 22, and a second tap 141 of the modulated optical signals 110 corresponding to the measurement component 24. Accordingly, each tap 139 and 141 includes a component of each optical signal 21. The compensation signal 136 output by compensating interferometer 30 represents a path-length difference between the reference component and measurement component of each optical signal 21 due to the optical modulators 6 and any other optical elements employed within optical module 16, for example, splitter 18 or optical assembly 40, as shown in FIG. 4. Accordingly, the compensating interferometer 30 measures only the contributions of the optical elements within optical module 16 to path-length variations within the interferometer apparatus. The compensation signal 136 is used by the signal processor 32 of FIG. 3, as discussed further below, so that any distances measured by the interferometer apparatus 1 are insensitive to phase shifts or path-length variations from the optical modulators 6 or any of the optical elements of optical module 16.

Figure 6:
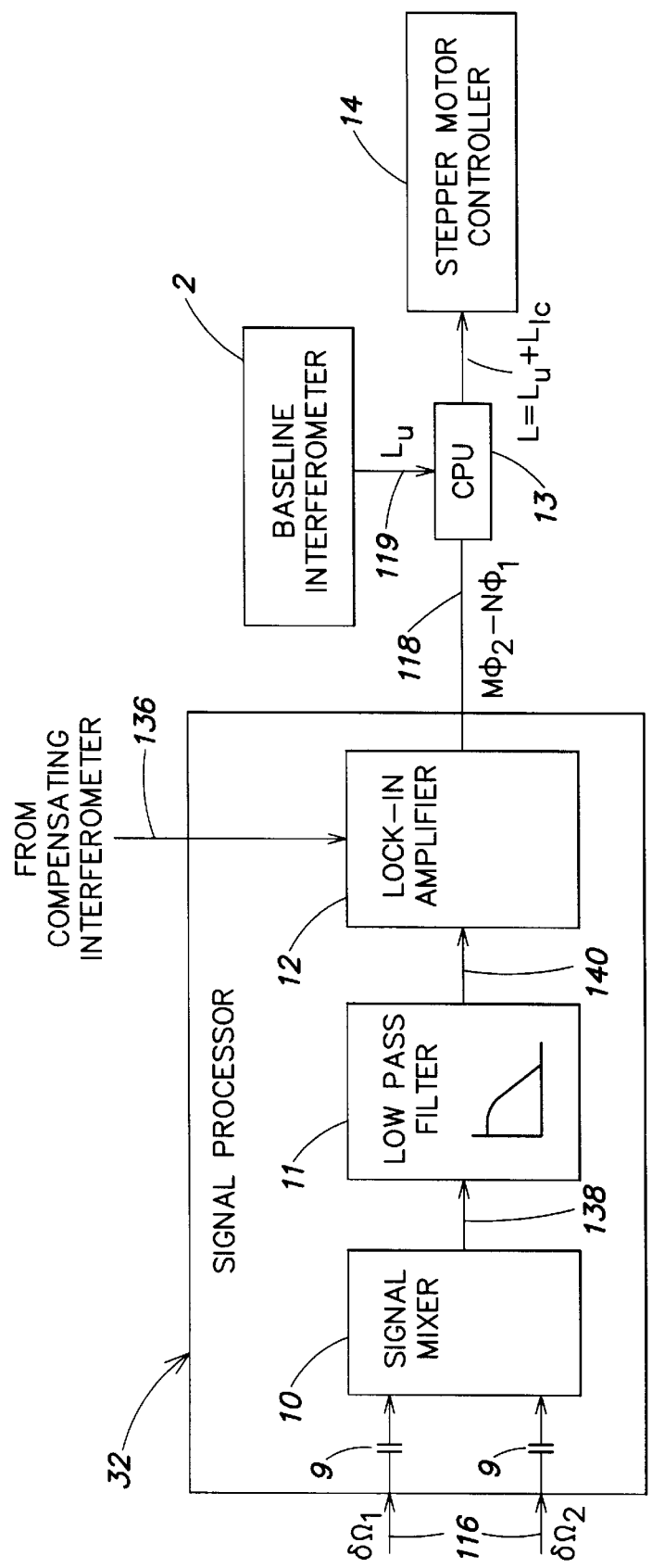
FIG. 6 is a block diagram of a signal processor of the two-color interferometer of FIG. 3, illustrating other associated processing components according to one embodiment of the invention.

FIG. 6 is a block diagram of signal processor 32 of the two-wavelength interferometer 1 shown in FIG. 3. FIG. 6 also illustrates other associated processing components, such as a CPU 13 and stepper motor controller 14, according to one embodiment of the invention. For purposes of illustration, the operation of the signal processor 32 will be explained using the modulating signal conditions M=1 and N=2 of Eq. (8). Furthermore, in the following example, only the reference component set 22 of FIG. 5 is modulated by respective optical modulators 6 such that, $$\Omega_{r2}=2\Omega_{r1}+\Delta. \qquad (9)$$

For example, if $\Omega_{r1}/2\pi$ were selected to be 40 MHz and $\Delta$ were selected to be in the range $10 \leq \Delta/2\pi \leq 50$ kHz, then $\Omega_{r2}/2\pi$ would be a signal in the vicinity of 80 MHz. It should be appreciated that, in this example, the difference signals 116 are then $\delta\Omega_1=\Omega_{r1}$ and $\delta\Omega_2=\Omega_{r2}$, since the measurement component set 24 is not modulated.

With reference now to FIG. 6, a signal processor 32 processes the difference signals 116 to output a correction signal 118 based on the beat frequency $\Delta$. The correction signal 118 represents a path-length difference between the measurement optical path traveled by the measurement components of the optical signals 21. In FIG. 6, the difference signals 116 output from the photodiode detectors proceed to respective high pass filters 9, which remove low frequency oscillations predominantly due to intensity fluctuations below approximately 1 MHz of the optical signals, such as fluctuations from a laser source. The filtered signals with frequencies $\delta\Omega_1$ and $\delta\Omega_2$ are respectively fed to a signal mixer 10 that generates a mixed signal 138.

As discussed further below in connection with FIG. 7, signal mixer 10 includes a heterodyne mixer to output the mixed signal 138 such that the mixed signal includes several frequency components having frequencies $\pm m\delta\Omega_1 \pm n\delta\Omega_2$, where m and n are integers. According to the present example in which $\delta\Omega_2=2\delta\Omega_1+\Delta$, among these frequency components is a low frequency component that is oscillating at the beat frequency $\Delta=\delta\Omega_2-2\delta\Omega_1$. This low frequency beat component is proportional to the product of the optical signal having an intensity $I_2$ and the square of the optical signal having an intensity $I_1$. Likewise, the phase of this low frequency beat component, or "beat frequency signal", is given by $$\phi=\pm m\phi_1 \pm n\phi_2=\phi_2-2\phi_1. \qquad (10)$$

This phase $\phi$ represents the path-length difference between the measurement optical paths of the respective optical signals having wavelengths $\lambda_1$ and $\lambda_2$ (or frequencies $\omega_1$ and $\omega_2$), and accordingly is the quantity of interest.

The mixed signal 138 including the low frequency beat component is fed to low pass filter 11 which isolates the beat frequency component and outputs the beat frequency signal 140. The beat frequency signal 140 may be given by $$S_{\Psi+\phi}=\sin\left[(\Delta)t+\Psi+\phi\right], \qquad (11)$$

where the total phase shift $\Psi+\phi$ includes a contribution $\Psi$ from optical path-length variations in optical modulators 6 and other optical elements in the optical module 16, as well as a contribution $\phi$ from path-length variations in the measurement arm 3 of the measurement optical path, as measured by the measurement components of optical signals 21.

As discussed above, compensating interferometer 30 of FIG. 5 outputs compensation signal 136 to the signal processor 32. The compensating interferometer 30 measures only the contributions of the optical modulators 6 and other optical elements of optical module 16 to path-length variations in the apparatus. The compensating signal 136 is given by $$S_\Psi = \sin[(\Delta)t + \Psi]. \tag{12}$$

FIG. 6 shows that the signal processor 32 further includes a lock-in amplifier 12 to process the beat frequency signal 140 and the compensation signal 136. The lock-in amplifier 12 outputs the correction signal 118 using $S_\Psi$ as a reference and $S_\Psi + \phi$ as an input signal to determine the quantity of interest $\phi$. This approach has the advantage that the signal processing is insensitive to phase shifts between the modulating signals 15 or any phase shifts or path-length differences due to the optical modulator 6 or the optical elements of optical module 16, since any such phase shifts or path-length differences cancel in the beat between $S_\Psi$ and $S_\Psi + \phi$.

In the case where the relationship between the optical signals 21 is such that $\lambda_2 = \lambda_1/2$ ($\omega_2 = 2\omega_1$), the phase $\phi$ is given by $$\phi = \phi_2 - 2\phi_1 = \frac{2\pi L}{\lambda_2}\beta_{21}\left[1 + \frac{\delta\rho}{\rho_0}\right] = \frac{2\pi}{\lambda_2}\zeta_{21}, \tag{13}$$

where Eqs. (6) and (7) have been used. From $\phi$, a microprocessor or CPU 13 calculates $\zeta_{21}$ and ultimately the path-length correction $L_{tc}$ according to Eq. (4), using the output $L_u$ of a baseline interferometer 2, discussed further below. The microprocessor 13 then performs the calculation according to Eq. (3), and for the turbulence-corrected path-length L continuously sends the value of L to a stepper-motor stage controller 14. According to the present invention, the rate at which the path-length correction is measured, calculated, and sent to the controller 14 should be large enough to resolve any significant variations due to air turbulence.

In the example illustrated above, while both optical signals $\omega_1$ and $\omega_2$ of reference component set 22 were respectively modulated by $\Omega_{r1}$ and $\Omega_{r2}$, and the measurement component set 24 was not modulated, in general both optical signals of both component sets may be modulated, according to Eq. (8). The phase quantity of interest associated with the beat frequency signal 140 (having frequency $\Delta$) at the output of the low filter pass 11 is then given by $$\phi = M\phi_2 - N\phi_1. \tag{14}$$

If the optical signals 21, having wavelengths $\lambda_1$ and $\lambda_2$, are chosen such that $\lambda_1 = (N/M)\lambda_2$, Eq. (13) will yield $$\phi = \frac{2\pi M}{\lambda_2}\zeta_{21}, \tag{15}$$

from which $L_{tc}$ can be calculated.

While Eq. (13) demonstrates a result for a specific example of harmonically related optical signals 21, in general an interferometer apparatus according to one embodiment of the invention may employ optical signals with no particular harmonic relationship. The extension of the invention to the case of a nonharmonic relationship between the optical signal wavelengths (or frequencies) allows the invention to provide advantages through the use of (1) optical signal sources that are less expensive and more reliable; (2) optical signal sources for which harmonic combination is difficult, but precise wavelength control is a well developed art; and (3) optical signal sources, at least one of which is a helium-neon laser, which is already the baseline optical signal source in a majority of metrology systems. Other advantages of nonharmonically related sources will be readily apparent to those skilled in the art.

An example of an interferometer apparatus according to one embodiment of the invention, employing optical signals having an arbitrary wavelength relationship, may utilize two exemplary signal processing techniques, direct digital synthesis and phase-locked-loop frequency multiplication. These techniques, either individually or together, may be incorporated in the electronic processing implemented by signal mixer 10 of signal processor 32. For example, as shown in FIG. 7, the difference signals 116 may be processed digitally, and an electronic transformation analogous to mixing converts at least one of the difference signals 116 from one frequency to another. Through such a transformation, the frequency of a signal of interest is in effect multiplied or divided by a predesignated constant factor that is not necessarily an integer.

For purposes of illustration, two optical signals 21 are considered, such that an optical frequency ratio of the optical signals is given by $\alpha = \omega_2/\omega_1$, wherein $\alpha$ is not necessarily an integer. With reference for the moment to FIG. 5, with no loss of generality, an example is considered in which the modulated optical signals 130 returning from measurement head 25, having frequencies $\omega_2 + \Omega_{r2}$ and $\omega_2 + \Omega_{m2}$, are combined interferometrically by beam combiner 35 to produce a difference signal 116 having a frequency $\delta\phi_2$, while the optical signals 130 having frequencies $\omega_1 + \Omega_{r1}$ and $\omega_1 + \Omega_{m1}$ are combined interferometrically by beam combiner 35 to produce a difference signal 116 having a frequency $\delta\Omega_2$. It is also assumed that $\delta\Omega_1 < \delta\Omega_2$.

The difference signal 116 at $\delta\Omega_1$ may be expressed as $\Psi_1(t) = \delta\Omega_1(t) + \phi_1(t)$, where $\phi_1$ is given by Eq. (6). This signal $\Psi_1(t)$ is digitally processed to synthesize a signal $\alpha'\Psi_1(t)$. The factor $\alpha'$ is chosen to lie as close as is convenient or possible to the ratio a between the optical frequencies $\omega_2$ and $\omega_1$. In one instance, this synthesis may be accomplished through a combination of digital processing techniques including phase-locked-loop frequency multiplication (PLL/FM) and direct digital synthesis (DDS). It is also possible to accomplish the synthesis using only one or the other of these two techniques. In the case in which the synthesis is accomplished through the combination of PLL/FM and DDS, the order of the PLL/FM or DDS signal processing is arbitrary, as discussed further below.

Figure 7:
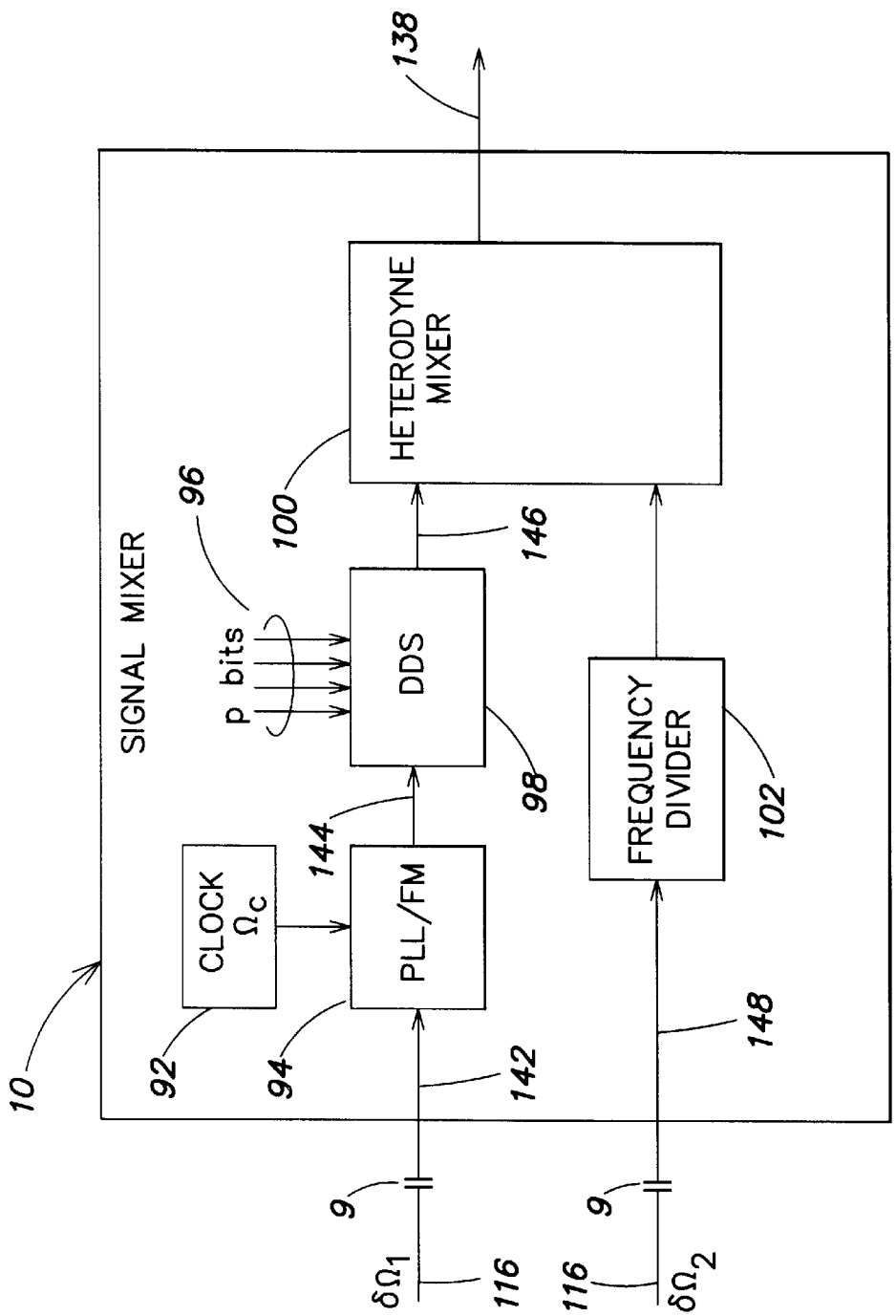
FIG. 7 is a block diagram of a signal mixer of the signal processor of FIG. 6.

FIG. 7 is a detailed block diagram of the signal mixer 10 of signal process 32 shown in FIG. 6. With reference to FIG. 7, one example of a digital signal processing technique suitable for purposes of the invention is as follows. An input signal 142, given by $\Psi_1(t)$, controls a clock 92 of higher frequency $\Omega_c$, by means of phase-locked loop frequency multiplier 94, such that the output 144 of multiplier 94, given by $$\Psi_c(t) = M'\Psi_1(t), \tag{16}$$

where M' is an integer, is phase-locked to $\Psi_1$ and has a frequency $\Omega_c = M'\delta\Omega_1$. The output 144 is a first multiplied difference signal which is then input to direct digital synthesizer 98 to generate a second multiplied difference signal 146, given by $$\psi_a(t) = \frac{N'}{2^P}\psi_c(t) = \frac{M'N'}{2^P}\psi_1(t), \quad (17)$$

where N' is an integer and p is the number of bits 96 used in the direct digital synthesizer 98 (values of p that are standard in current digital synthesizers are 16, 28, and 32). The integers M' and N' are chosen to make the ratio $$a' = \frac{M'N'}{2^P} \quad (18)$$

as close to a as is convenient or possible, as discussed above. The second multiplied difference signal 146 ($\Psi_\alpha(t)$), which is modulated at the frequency $\alpha\delta\Omega_1$, is then mixed with the difference signal 148 of difference signals 116, having a frequency $\delta\Omega_2$, in heterodyne mixer 100 to obtain the mixed signal 138 which includes the low frequency beat component having the beat frequency $\Delta$, in a manner analogous to the case of harmonically related optical signal frequencies, as discussed above.

It is easily shown that by choosing N' as $$N' = \text{int}\left(a\frac{2^P}{M'} + 0.5\right), \quad (19)$$

where int is the integer function $\alpha'$ periodically deviates from $\alpha$ as $\alpha$ is varied. In the course of this periodic variation, the maximum fractional deviation u between $\alpha'$ and $\alpha$ is given by $$u_{\max} = \frac{M'}{a}\frac{1}{2^P+1}. \quad (20)$$

For example, for $\alpha$ $\pi/2$ and M'=10, the following table indicates the dependence of $u_{max}$ on p.

| p  | $\mu_{\max}$ |
|----|-----------|
| 16 | $4.8 \times 10^{-5}$ |
| 28 | $1.2 \times 10^{-8}$ |
| 32 | $7.4 \times 10^{-10}$ |

The above table shows that utilizing a direct digital synthesizer 98 having a large number of p bits 96 is advantageous, since it decreases the fractional frequency deviation.

It should be noted that in the signal processing technique of combining PLL/FM with DDS as discussed above, the purpose of the PLL/FM is to achieve higher phase resolution by the factor M' and thereby allow phase to be measured more precisely. If the PLL/FM is eliminated, the above analysis still holds, except that M' is identically unity; by appropriate choice of p and N', the radio $\alpha'$ can still be made close to $\alpha$.

It should also be noted that in the example outlined above, the signal processing utilized PLL/FM as a first step and DDS as a second step. The alternative order, in which the signal is first processed by DDS and then by PLL/FM, is also possible.

Additionally, the PLL/FM may be used with no DDS to achieve an $\alpha'$ that is close to $\alpha$. FIG. 7 shows that variants of phase-locked-loop frequency synthesis include frequency division. Frequency divider 102 may include at least one of a fractional-N phase-locked-loop (FNPLL) divider and a multi-loop divider. These types of phase-locked-loop synthesizers generate a signal whose output frequency is a fractional multiple of the input frequency, but is otherwise locked to it in phase. That is, such PLLs can be used to directly divide signal 148, given by $\Psi_2(t)=\delta\Omega_2(t)+\phi_2(t)$, by the non-integral factor a, with no need for any additional DDS.

As discussed above, after the signal processing of non-harmonically related optical sources is completed using any of the foregoing techniques, $\alpha'$ may not be precisely equal to $\alpha$. The deviation of $\alpha'$ from a modifies the dependence of the total path length L given by Eq. (3) on the measured fringe count f of the two-wavelength interferometer and on the measured fringe count $f_b$ of a baseline interferometer. For example, let $s=\lambda_2 f$, $s_b=\lambda_b f_b$, and $u=(\alpha'-\alpha)/\alpha$. The dependence of L on s and $s_b$ is $$L' = \left[s_b\left(1-u\frac{\beta_1}{\beta_{21}}\right) - s\frac{\beta_b}{\beta_{21}}\right]\left[1+u\frac{(\beta_b-\beta_1)}{\beta_{21}}+u\beta_b\left(1-\frac{\beta_1}{\beta_{21}}\right)\right]^{-1}. \quad (22)$$

When u=0 (i.e., when $\alpha'=\alpha$), this expression reduces to $$L = s_b - s\frac{\beta_b}{\beta_{21}}, \quad (23)$$

which is precisely the expression that would hold for harmonically related optical signals when $\alpha=\alpha$. Thus, as long as $\alpha$ and $\alpha'$ remain fixed in value, the fact that $\alpha'\neq\alpha$ does not introduce any particular difficulty in the operation of an interferometer apparatus according to the invention. This condition merely modifies the expression for stage displacement L from Eq. (23) to Eq. (22). L is still a simple function of s and $s_b$, except that the functional dependence is different from the case u=0. However, the correct value of L is obtained, limited only be the precision with which a and $\alpha'$ are known. It should be appreciated that the advantage of the condition $\alpha'=\alpha$ is that it makes the phase of the signal oscillating at the beat frequency $\Delta$ relatively insensitive to stage position changes and relatively sensitive to changes in air-path thickness. As $\alpha'$ deviates from $\alpha$, this advantage is lost.

The effect on the position measurement when either $\alpha$ or $\alpha'$ vary in time in an unknown fashion, leading to a temporal variation, $\Delta u$, in u, is now considered. Such a variation produces an error $\Delta L'$ in the stage position measurement. From Eq. (22) it follows that for small $\Delta u$ $$\Delta L' \simeq -s_b\frac{\beta_b}{\beta_{21}}\Delta u. \quad (24)$$

One can now determine how large a value $\Delta u_p$ of $\Delta u$ is permitted if its effect on position error is to be no larger than some value $\Delta L$. The result is $$\Delta u_p \simeq \frac{\beta_{21}}{\beta_b}\frac{\Delta L}{L'}. \quad (25)$$

For example, for L'=10 cm, $\Delta L$ 1 nm, and $\beta_{21}/\beta_b=2\times 10^{-2}$, Eq. (14) indicates that $\Delta u_p$ $2\times 10^{-10}$.

For harmonically related optical signals, the frequencies of the optical signals may vary, but they are locked so as to remain in a harmonic ratio. For optical signals having arbitrary wavelength relationships however, the optical signals are generally not locked to one another, hence the frequency of each optical signal must be stable to better than the fractional level $\Delta u_p$ given by Eq. (25) in order to limit the error in position measurement, as discussed above. If one of the optical signals is provided by a 633-nm He-Ne laser, its frequency must thus be stabilized to better than 100 kHz. This level of stabilization is well within the present state of the art. Alternatively, as discussed above and as shown in FIGS. 3 and 5, the optical signals may be "locked" to the same resonator cavity 120. If the optical sources are locked in this manner, the ratio of their frequencies is fixed by the length of the resonator cavity 120.

Returning to FIG. 6, an enhanced precision interferometric distance measurement system according to one embodiment of the invention includes microprocessor (CPU) 13 to modify a baseline distance measurement 119 from a baseline interferometer 2 with the correction signal 118 to provide a corrected distance measurement, for example, a distance measurement corrected for atmospheric disturbances such as air turbulence in the measurement arm 3 of a measurement optical path, as shown schematically in FIGS. 3 and 4. The baseline distance measurement 119 represents a path-length difference between the reference optical path and the measurement optical path in the interferometer apparatus. The baseline interferometer 2 may, for example, in fact be that portion of interferometer apparatus 1 shown in FIG. 3 comprising only one optical signal 21. In this manner, one of the difference signals 116 corresponding to a respective optical signal of optical signals 21 is utilized to provide the baseline distance measurement 119.

Accordingly, an interferometer apparatus according to one embodiment of the invention, having only two optical signals 21, outputs both a baseline distance measurement signal 119 and a correction signal 118 to provide an enhanced precision interferometric distance measurement. Alternatively, as shown in FIG. 1, the baseline interferometer 2 may comprise a third optical signal 20 that is integrated with optical signals 21 to travel the measurement and reference optical paths of the interferometer apparatus.

Figure 8:
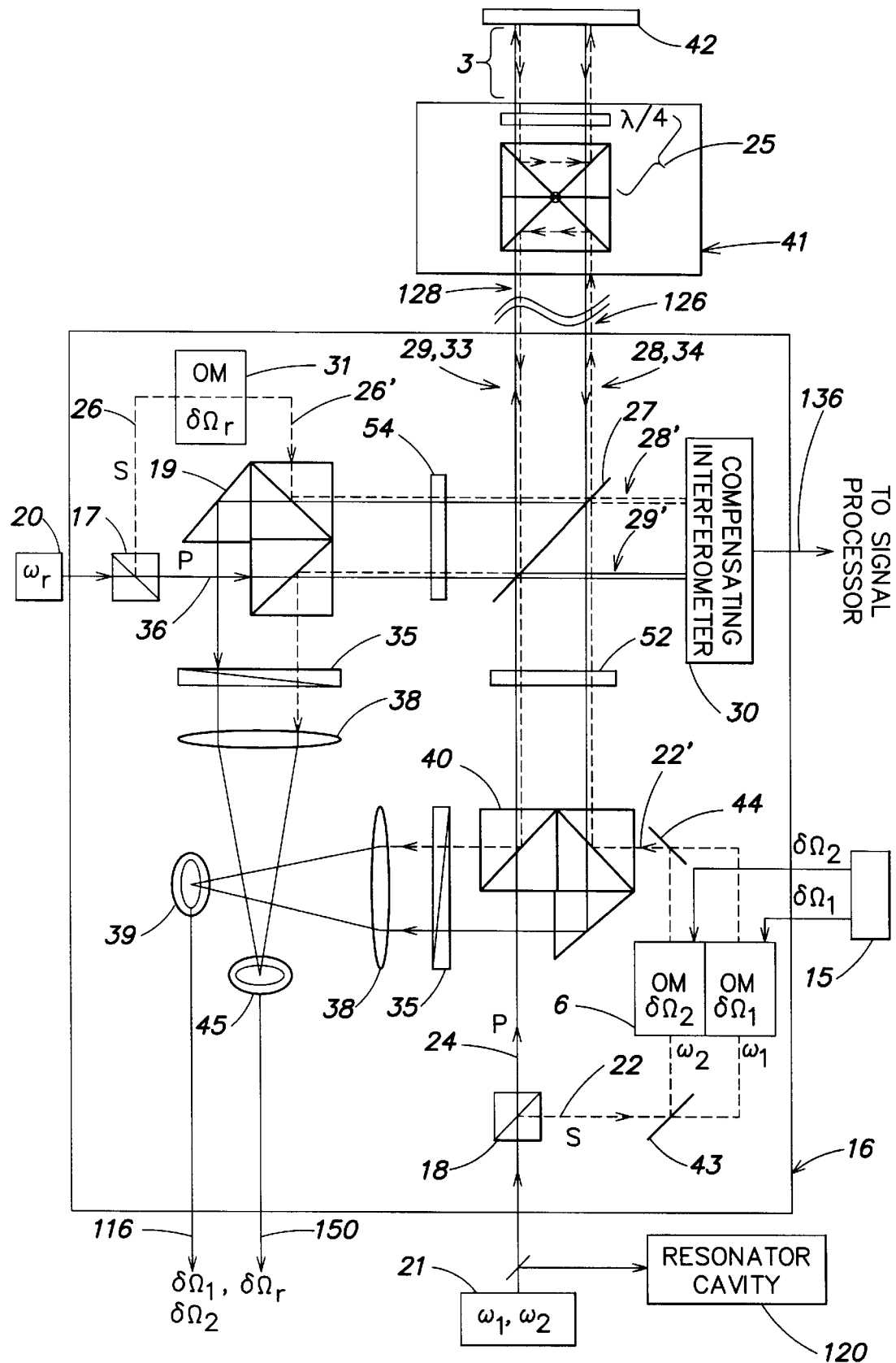
FIG. 8 is a block diagram of an enhanced precision interferometric distance measurement apparatus according to one embodiment of the invention, using three optical signals.

FIG. 8 shows an example of an enhanced precision interferometric distance measuring apparatus according to one embodiment of the invention that performs both a baseline distance measurement and corrects for disturbances in measurement arm 3 by using three optical signals. A baseline optical signal 20 has an optical frequency $\omega_r$. As in FIG. 3, optical signals 21 have optical frequencies $\omega_1$ and $\omega_2$. Within the optical module 16, each optical signal ($\omega_1$, $\omega_2$, $\omega_r$) is split by polarization and frequency shift, preferably in the vicinity of any sources providing the optical signals 20 and 21. Polarizing splitters 17 and 18 divide each optical signal incident upon them into two components, for example, an s-polarization component and a p-polarization component. As shown in the example of FIG. 8, the p-polarization component passes through the polarizing splitters 17 and 18 with its direction of propagation unchanged, whereas the direction of propagation of the s-polarization component is "deflected" by the splitters.

In FIG. 8, the s-polarization components of optical signals 21 exiting splitter 18 are shown to form reference component set 22, while the p-polarization components exiting splitter 18 are shown to form measurement component set 24. Alternatively, the optical elements of optical module 16 may be arranged so that the reference component set 22 includes the p-polarization components of optical signals 21 and the measurement component set 24 includes the s-polarization components of optical signals 21. After splitter 18, the reference components having respective optical frequencies $\omega_1$ and $\omega_2$ of reference components 22 are spatially separated by a dichroic splitter 43.

The s-polarized component of each optical signal $\omega_1$ and $\omega_2$ is frequency-shifted in respective optical modulators (OMs) 6, while the p-polarized measurement components of measurement component 24 remains unshifted in frequency. As discussed above in connection with FIG. 5, the measurement component set 24 may be modulated as well, according to the modulating frequency relationships given by Eq. (8). As shown in FIG. 8, placing the OMs 6 near the optical signals 21, rather than within the measurement head 25, ensures that heat generated by the OMs does not disturb the interferometer head temperature distribution. The frequency-shifted s-polarized reference components are spatially recombined by a dichroic mirror 44 to form a modulated reference component set 22'. The modulated reference component set 22' as well as the frequency-unshifted p-polarized measurement component set 24 pass through and are directed by a first optical assembly 40, comprising two polarizing beam splitters and a prism, on to a partial mirror 27.

Similarly to the optical signals 21, an s-polarized reference component 26 of the baseline optical signal 20 is frequency-shifted by optical modulator 31, and both a frequency-shifted s-polarized reference component 26' and a frequency-unshifted p-polarized component 36 of the baseline optical signal 20 pass through and are directed by a second optical assembly 19, similar to optical assembly 40, on to partial mirror 27.

At the partial mirror 27, the frequency-shifted s-polarized reference component set 22' of the optical signals 21 is combined with the frequency-shifted s-polarized reference component 26' of the baseline optical signal 20. The frequency-unshifted, p-polarized measurement component set 24 of the optical signal 20 and the baseline p-polarized measurement component 36 are similarly combined. Hence, two distinct three-wavelength components sets 28 and 29 are formed, a first component set 28 which has been frequency-shifted by passage through OMs, and a second component set 29 which is frequency-unshifted. Each three-wavelength component set comprises three spatially overlapping optical signals at or near the optical frequencies $\omega_1$, $\omega_2$ and the baseline frequency $\omega_r$, but the two three-wavelength component sets 28 and 29 are spatially separated from each other. Each of the two three-wavelength component sets 28 and 29 are transmitted to the interferometer measurement head 25. Two corresponding three-wavelength component sets 28' and 29' additionally exit from partial mirror 27 as "tapped" portions of the component sets 28 and 29, and proceed to compensating interferometer 30, which measures any phase shifts due to path-length drifts within the OMs 6 and 31 and other optical elements of the optical module 16, for example, the optical assemblies 19 and 40.

The interferometer measurement head 25 is again shown schematically in FIG. 8 for purposes of illustration. The measurement head 25 may be mounted, for example, to a stepper stage 41 of a wafer processing or alignment system. The frequency-unshifted three-wavelength component measurement set 29 enters the measurement head 25 p-polarized along path 128 and leaves it as an exiting component set 34, still p-polarized, along path 126.

In contrast, the frequency-shifted three-wavelength reference component set 28 enters the measurement head 25 s-polarized along path 126 and leaves it as an exiting component set 33, still s-polarized, along path 128. Thus, on its way to and from the measurement head 25, each three-wavelength component set 28 plus 33 and 29 plus 34 travels the same path as the other, albeit counter-propagating in directions opposite to one another.

Within the measurement head 25, the paths of the frequency-shifted and frequency-unshifted three-wavelength component sets are distinct but equal in magnitude. The optical paths of the three-wavelength component sets differ only in the measurement arm 3, shown for example in FIG. 8 between the stepper stage 41 and a fixed mirror 42.

It should be appreciated that due to the unique arrangement of the measurement head and the optical elements of optical module 16, differently polarized components are not constrained to travel identical or shared paths in the same direction throughout the interferometer apparatus. As discussed in connection with FIG. 4, this feature eliminates any "crosstalk" between the different polarization components due to polarization leakage, because the differently polarized components do not share any polarization optics. In particular, optical assemblies 19 and 40 include "dedicated" polarizing splitters which merely direct differently polarized components rather than split an optical signal into constituent polarization components.

Continuing with FIG. 8, the optical module 16 receives the two exiting component sets 33 and 34 returning from the measurement head 25—one frequency-shifted and the other frequency-unshifted, respectively—and divides the component sets again, by optical frequency, at partial mirror 27. A filter 52 may be used to attenuate any residual baseline optical signal in the $\omega_1$ and $\omega_2$ components leaving the partial mirror 27. Likewise, a filter 54 may be used to attenuate any residual $\omega_1$ and $\omega_2$ optical signals in the baseline components leaving the partial mirror 27.

The optical signal components leaving partial mirror 27 are directed by optical assemblies 19 and 40 to polarizer/analyzing interferometric beam combiners 35. The beam combiners 35 are each oriented at 45° with respect to s- and p-planes of polarization and thereby interferometrically combine the frequency-unshifted p-polarized components with the frequency-shifted s-polarized components for each optical signal. Lenses 38 focus the interferometrically combined components exiting from each polarizer/analyzing beam combiner 35 onto respective photodiode detectors 39 and 45. In FIG. 8, differently from FIG. 5, only one photodiode detector 39 is shown for the $\omega_1$ and $\omega_2$ optical signals 21, as explained above. Photodiode detector 45 is for the baseline optical signal 20 at $\omega_r$. Alternatively, two separate detectors (7 and 8 in FIG. 5) may be used instead of photodiode detector 39 to individually detect the optical signals 21 at $\omega_1$ and $\omega_2$, respectively. The output of photodiode detector 45 provides a baseline difference signal 150, used to calculate the baseline measurement signal 119 in FIG. 6, and the output of photodiode detector 39 provides the difference signals 116.

As discussed above, the compensating interferometer 30 corrects for path-length differences between the s-polarized components and the p-polarized components due to the various optical elements in the optical module 16, including the optical modulators 6. While its primary purpose is to provide a reference for the two-wavelength interferometer signal processing via compensation signal 136, it may also serve the baseline system as well.

Optically, the compensating interferometer 30 performs the same functions as the combined polarizer/analyzing beam combiners 35, lenses 38 and photodiode detector 39 for light beams 28' and 29' that have not gone to the interferometer measurement head 25. Electronically, the signals from a photodiode detector in the compensating interferometer are processed in a similar manner to that explained in connection with FIG. 6, with reference to elements 9, 10 and 11, to generate the compensation signal 136. The compensation signal 136 is used as a reference input for the lock-in amplifier 12 of FIG. 6, as discussed above. The use of the compensating interferometer 30 facilitates a system design which does not constrain the measurement component set to traverse a path (except for the measurement arm distance) identical to the reference component set, and thus further facilitates a solution to the polarization leakage problem.

FIG. 9 shows an example of an arrangement of optical elements constituting the interferometer measurement head 25 according to one embodiment of the present invention. The optical signal flow of the apparatus shown in FIG. 8 is used for purposes of illustration to explain the optical signal flow in the measurement head 25 shown in FIG. 9. As illustrated in FIG. 8, from the optical module 16 the frequency-shifted components of all three optical signals forms a three-wavelength incident reference component set 28 with a common s-polarization. Similarly, the frequency-unshifted components of all three optical signals forms a three-wavelength incident measurement component set 29 whose common polarization is p. Upon entering the measurement head 25, each component set encounters a Glan prism 60 that very efficiently separates p and s-polarized components, transmitting p and reflecting s. The two three-wavelength component sets 28 and 29 subsequently follow different paths within the measurement head 25.

The frequency-unshifted component set 29, incident with p-polarization on path 128, passes through a first Glan prism 60, through a second Glan prism 62 and through a first Fresnel rhomb 64. A Fresnel rhomb is an achromatic quarter-wave plate that converts the polarization of this component set to circular. From the rhomb 64, the component set propagates through the measurement arm 3 to the mirror 42 and is completely reflected. Returning from the mirror 42, it is converted by the rhomb 64 into an s-polarized component set that is reflected at an internal face of Glan prism 62 to a roof prism 66. After leaving the roof prism 66 and passing into Glan prism 62, the component set is reflected from an internal face of prism 62 through the Fresnel rhomb 64. The rhomb 64 converts the s-polarized component set to a circular polarization, and the component set makes a second round-trip through the measurement arm 3. The component set is then converted by rhomb 64 from circular to p-polarization. The component set subsequently passes through prisms 62 and 60. It thus emerges from the head on path 126 as a p-polarized frequency-unshifted component set 34 that is overlapped with, but counter-propagating against, the incident s-polarized three-wavelength frequency-shifted component set 28.

The three-wavelength frequency-shifted component set 28 is incident to Glan prism 60 with s-polarization on path 126. It is thus reflected from the internal face of prism 60 through a second Fresnel rhomb 68 which converts the polarization to circular. A reflective coating 70 on the exit face of this rhomb reflects this component set back. Upon passing through rhomb 68 and returning into Glan prism 60, the polarization of this component set is converted from circular to p, hence it is transmitted into Glan prism 62 and loops through the roof prism 66. After returning from the roof prism, its polarization is still p, hence it is transmitted from prism 62 through prism 60, back through the Fresnel rhomb 68 and reflective coating 70 and back into prism 60, except that its polarization has been converted back to s. Upon reflection from an internal face of prism 60, this component set emerges from the head on path 128 as an s-polarized frequency-shifted component set 33 that is overlapping with, but counter-propagating against, the incident three-wavelength p-polarized frequency-unshifted component set 29.

The exemplary embodiments described above illustrate how the method and apparatus of the present invention simultaneously solves several problems common to conventional interferometer systems. First, for each optical signal, the measurement and reference components counter-propagate over distinct but identical path-lengths between the optical module 16 and the interferometer measurement head 25. In general, the invention may distinguish the measurement and reference components, for example, by propagation direction in a given path, spatial separation, polarization, or any combination of these distinctions. This feature makes the interferometer sensitive only to path variations within the measurement arm 3, and is facilitated by the use of the compensating interferometer 30 to correct for path-length variations within the optical modulators 6 and other optical elements.

Second, the paths through the optical elements within the measurement head 25 are balanced in the sense that both measurement and reference components travel the same path-length through Glan prisms, Fresnel rhombs and a roof prism. Because of this path-length balance, the measurement head is extremely insensitive to temperature variations. This feature overcomes a significant temperature-drift problem also common to conventional interferometers.

Third, the interferometer measurement head is a monolithic "block" that includes a plurality of optical elements which are adhered to each other, for example, using a suitable optical adhesive. This monolithic design makes the measurement head rugged and inherently insensitive to motion and vibration.

Fourth, the interferometer measurement head is achromatic. The components of the optical signals are split by polarization using only internal reflections, which are intrinsically achromatic. All polarization transformations are provided by Fresnel rhombs whose retardations equal 0.250±0.002 waves at the wavelengths of interest.

Fifth, optical nonlinearity "crosstalk" due to polarization leakage, another problem common to conventional interferometers, is substantially reduced according to the method and apparatus of the invention. Glan prisms having an extinction ratio of approximately $10^5$:1, and, as noted above, Fresnel rhombs providing extremely precise quarter-wave retardations, the phase error due to polarization leakage is estimated to be less than $10^{-5}$ waves, which represents an improvement by approximately 300 over conventional interferometers.

In summary, according to the present invention, a two-wavelength interferometer may be added or "retrofit" to an existing baseline interferometric measuring system to enhance the precision of distance measurements. Alternatively, a single-wavelength interferometer may be added or "retrofit" to an existing baseline system to allow for measurement precision enhancement and correcting for errors, such as those due to air turbulence. The optical signal of the single-wavelength interferometer may or may not be harmonically related to the baseline optical signal, which can easily serve as one of the two optical signals required to measure the optical path length difference due to the wavelength-dependent refractive index of air, while simultaneously measuring absolute position.

Alternatively, a two-wavelength interferometer according to the invention may function as a stand-alone system, measuring absolute distance or position and simultaneously correcting for measurement errors, including those due to air turbulence. The stand-alone interferometer may use analog radio-frequency (RF) heterodyne-mixing signal processing techniques or digital signal processing techniques, alone or in combination, for the turbulence correction measurements, and a novel measurement head design which eliminates polarization leakage, as described herein. Either one of the two optical signals may be used to make the baseline distance or absolute position measurement.

An example of a positioning system according to the present invention is a multiple-axis positioning system which employs one two-wavelength enhanced precision interferometer according to the invention for each degree of freedom of movement, or positional axis. The two-wavelength interferometer may be used for the purposes of measurement precision enhancement, as an addition to a multiple-axis baseline measurement apparatus used to measure absolute distance in the positioning system. Alternatively, the two-wavelength interferometer may measure both absolute distance or position and correct for errors, such as those due to air turbulence, simultaneously for each axis. Additionally, one optical signal source may be used for each wavelength required, regardless of the number of axes controlled by the positioning system. The respective optical signal source powers may be split amongst the respective interferometers required for each axis.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting.

What is claimed is:

1. An interferometer apparatus, comprising:

at least one optical signal;

a splitter to divide each at least one optical signal into a reference component and a measurement component, to form a reference component set and a measurement component set;

a plurality of optical elements arranged to direct the reference component set through a reference optical path and the measurement component set through a measurement optical path, wherein at least a portion of each of the reference optical path and the measurement optical path includes a shared optical path that is common to both the reference optical path and the measurement optical path, and wherein the reference component set and the measurement component set counter-propagate along the shared optical path; and at least one detector to detect the reference and measurement components of each at least one optical signal after the components have traveled through the reference and measurement optical paths, respectively, and to output at least one difference signal based on a first path-length difference between the reference and measurement optical paths, each at least one difference signal corresponding to a respective at least one optical signal;

wherein the plurality of optical elements includes a measurement head, the plurality of optical elements arranged such that the reference and measurement component sets arrive at the measurement head on spatially separated first and second paths, respectively; and wherein the measurement head is constructed and arranged so as to direct the reference component set through at least one pass of the reference optical path, the reference component set exiting the measurement head through the second path, and to direct the measurement component set through at least one pass of the measurement optical path, the measurement component set exiting the measurement head through the first path.

2. The apparatus of claim 1, wherein the reference component set has a different polarization to the measurement component set.

3. The apparatus of claim 1, wherein reference and measurement component sets traveling in a like direction along respective portions of the reference and measurement optical paths, not including the shared optical path, are spatially separated.

4. The apparatus of claim 1, wherein the reference and measurement component sets travel like path-lengths through the measurement head.

5. The apparatus of claim 1, wherein:
the splitter is a polarizer, the reference component set having a first polarization and the measurement component set having a second polarization, the first polarization being orthogonal to the second polarization; and
the measurement head is constructed and arranged such that the reference component set exits the measurement head with the first polarization and the measurement component set exits the measurement head with the second polarization.

6. The apparatus of claim 5, wherein the polarizer, the plurality of optical components, and the measurement head are arranged so as to substantially minimize an optical nonlinearity of each at least one difference signal due to a polarization leakage between the reference and measurement component sets.

7. The apparatus of claim 5, wherein the plurality of optical elements includes an interferometric beam combiner to rotate the first and second polarizations of the reference and measurement components of each optical signal, respectively, before the reference and measurement components are detected by the detector.

8. The apparatus of claim 5, wherein the measurement head includes:
first and second polarizing prisms;
first and second quarter-wave retarders; and
a directing prism.

9. The apparatus of claim 8, wherein each polarizing prism of the first and second polarizing prisms deflects components having the first polarization and passes components having the second polarization.

10. The apparatus of claim 8, wherein the measuring head is arranged such that the first polarizing prism receives the reference component set on the first path, outputs the reference component set on the second path, receives the measurement component set on the second path and outputs the measurement component set on the first path.

11. The apparatus of claim 8, wherein one quarter-wave retarder of the first and second quarter-wave retarders includes a reflective coating.

12. The apparatus of claim 8, wherein the first and second polarizing prisms, the first and second quarter-wave retarders and the directing prism are achromatic.

13. The apparatus of claim 8, wherein the first and second polarizing prisms, the first and second quarter-wave retarders and the directing prism are adhered to each other to form a monolithic measurement head.

14. The apparatus of claim 1, further including at least one optical modulator to modulate at least one component of the reference and measurement components of a first optical signal of the at least one optical signal, wherein:
the reference component of the first optical signal has a first optical frequency and the measurement component of the first optical signal has a second optical frequency, the second optical frequency being shifted from the first optical frequency by a first known frequency $\delta\Omega_1$; and
a first difference signal of the at least one difference signal, corresponding to the first optical signal, has the first known frequency $\delta\Omega_1$.

15. The apparatus of claim 14, wherein:
the at least one optical signal includes a second optical signal; and
the at least one optical modulator includes at least a first additional optical modulator to modulate at least one component of the reference and measurement components of the second optical signal, wherein:
the reference component of the second optical signal has a third optical frequency and the measurement component of the second optical signal has a fourth optical frequency, the fourth optical frequency being shifted from the third optical frequency by a second known frequency $\delta\Omega_2$; and
a second difference signal of the at least one difference signal, corresponding to the second optical signal, has the second known frequency $\delta\Omega_2$.

16. The apparatus of claim 15, wherein the apparatus further includes a first signal processor to process the first and second difference signals to output a correction signal based on a beat frequency $\Delta$ derived from the first and second known frequencies $\delta\Omega_2$ and $\delta\Omega_1$, the beat frequency being substantially less than each of $\delta\Omega_2$ and $\delta\Omega_1$, the correction signal representing a second path-length difference between the measurement optical paths traveled by the measurement components of the first and second optical signals, respectively.

17. The apparatus of claim 16, wherein M $\delta\Omega_2$=N $\delta\Omega_1$+$\Delta$, M and N being integers.

18. The apparatus of claim 16, wherein the first and second optical signals are harmonically related.

19. The apparatus of claim 16, further including a resonator cavity to lock the first optical signal to the second optical signal such that a constant frequency ratio is maintained between the first and second optical signals.

20. The apparatus of claim 16, wherein the first signal processor includes:
a signal mixer to output a mixed signal including a plurality of frequency components based on the first and second difference signals, the plurality of frequency components including a beat frequency component having the beat frequency $\Delta$; and
a low-pass filter to isolate the beat frequency component and output a beat frequency signal based on the beat frequency component.

21. The apparatus of claim 20, wherein the signal mixer includes a phase-locked loop frequency multiplier to process at least one of the first difference signal and the second difference signal.

22. The apparatus of claim 20, wherein the signal mixer includes a direct digital synthesizer to process at least one of the first difference signal and the second difference signal.

23. The apparatus of claim 20, wherein the signal mixer includes one of a fractional-N phase-locked loop frequency divider and a multi-loop phase-locked loop frequency divider to process at least one of the first difference signal and the second difference signal.

24. The apparatus of claim 20, wherein the signal mixer includes:
   a reference clock having a reference clock frequency that is an integer multiple of a lesser frequency of the first and second known frequencies;
   a phase-locked-loop frequency multiplier to output a first multiplied difference signal based on the reference clock, the phase-locked-loop frequency multiplier controlling the reference clock such that a phase of the first multiplied difference signal is locked to a phase of one difference signal of the first and second difference signals having the lesser frequency, and a frequency of the first multiplied difference signal is the reference clock frequency;
   a direct digital synthesizer to multiply the first multiplied difference signal to output a second multiplied difference signal; and
   a heterodyne mixer to output the mixed signal based on the second multiplied difference signal and another difference signal of the first and second difference signals not having the lesser frequency.

25. The apparatus of claim 20, further including a compensating interferometer to receive a first tap of the reference component set and a second tap of the measurement component set, each tap of the first and second taps including each at least one optical signal, each tap being taken from a respective component set after the at least one optical modulator and before the component sets arrive to the measurement head, the compensating interferometer outputting a compensation signal based on a third path-length difference between the reference component and measurement component of each at least one optical signal due to the plurality of optical elements and the at least one optical modulator.

26. The apparatus of claim 25, wherein the first signal processor further includes a lock-in amplifier to process the beat frequency signal and the compensation signal to output the correction signal.

27. The apparatus of claim 16, further including a second signal processor to modify a baseline distance measurement based on the first path-length difference with the correction signal to provide a corrected distance measurement.

28. The apparatus of claim 27, wherein one difference signal of the first and second difference signals provides the baseline distance measurement.

29. The apparatus of claim 27, wherein:
   the at least one optical signal includes a third optical signal; and
   the at least one optical modulator includes at least a second additional optical modulator to modulate at least one component of the reference and measurement components of the third optical signal, wherein:
   the reference component of the third optical signal has a fifth optical frequency and the measurement component of the third optical signal has a sixth optical frequency, the fifth optical frequency being shifted from the sixth optical frequency by a third known frequency $\delta\Omega_3$; and
   a third difference signal of the at least one difference signal, corresponding to the third optical signal, has the third known frequency $\delta\Omega_3$.

30. The apparatus of claim 29, wherein the third difference signal provides the baseline distance measurement.

31. An interferometer apparatus, comprising:
   an optical module to modulate at least first and second optical signals with at least first and second modulating signals, respectively, to provide at least first and second modulated optical signals; and
   a measurement head optically coupled to the optical module and constructed and arranged to direct each modulated optical signal of the at least first and second modulated optical signals through at least one of a reference optical path and a measurement optical path;
   wherein at least a portion of the reference optical path and measurement optical path includes a shared optical path that is common to both the reference optical path and measurement optical path, and wherein the first and second modulated optical signals counter-propagate along the shared optical path; and
   wherein the optical module is constructed and arranged to optically process each modulated optical signal, after each modulated optical signal has traveled through at least one of the reference and measurement optical paths, to output at least two difference signals, each difference signal of the at least two difference signals corresponding to a respective modulated optical signal of the at least two modulated optical signals and having a difference signal frequency derived from a respective modulating signal of the at least two modulating signals, each difference signal representing a first path-length difference between the reference and measurement optical paths of the respective modulated optical signal.

32. The apparatus of claim 31, further including a signal processor to process the at least two difference signals to output a correction signal based on a beat frequency derived from the first and second modulating signals, the correction signal representing a second path-length difference between the measurement optical paths of the first and second modulated optical signals.

* * * * *